(12) United States Patent
Strauss et al.

(10) Patent No.: US 9,441,753 B2
(45) Date of Patent: Sep. 13, 2016

(54) PRINTED CIRCUIT BOARD ELECTRORHEOLOGICAL FLUID VALVE

(71) Applicant: Boston Dynamics, Inc., Waltham, MA (US)

(72) Inventors: Marc Strauss, Medford, MA (US); Michael Murphy, Waltham, MA (US)

(73) Assignee: Boston Dynamics, Waltham, MA (US)

( * ) Notice: Subject to any disclaimer, the term of this patent is extended or adjusted under 35 U.S.C. 154(b) by 399 days.

(21) Appl. No.: 13/873,294

(22) Filed: Apr. 30, 2013

(65) Prior Publication Data

US 2014/0319390 A1  Oct. 30, 2014

(51) Int. Cl.
  *F15C 1/04* (2006.01)
  *F16K 31/02* (2006.01)
  *H05K 1/02* (2006.01)
  *H05K 3/46* (2006.01)
  *H05K 3/00* (2006.01)
  *H05K 3/42* (2006.01)

(52) U.S. Cl.
  CPC ............. *F16K 31/02* (2013.01); *H05K 1/0272* (2013.01); *H05K 3/4697* (2013.01); *H05K 3/0047* (2013.01); *H05K 3/429* (2013.01); *H05K 3/4611* (2013.01); *H05K 2203/063* (2013.01); *Y10T 29/49124* (2015.01); *Y10T 29/49165* (2015.01)

(58) Field of Classification Search
  CPC ............... F16K 31/02; H05K 1/0272; H05K 2203/063; H05K 3/4697; H05K 3/4611; H05K 3/0047; H05K 3/429; Y10T 137/0324; Y10T 137/0391; Y10T 137/8593; Y10T 137/2082; Y10T 137/2191

USPC ...... 137/827, 2, 807, 13, 561 R, 909; 251/62
  See application file for complete search history.

(56) References Cited

U.S. PATENT DOCUMENTS

| | | | |
|---|---|---|---|
| 2,417,850 A | 3/1947 | Winslow | |
| 2,661,596 A | 12/1953 | Winslow | |
| 3,405,728 A | 10/1968 | Dexter | |
| 3,416,549 A * | 12/1968 | Chaney et al. | 137/827 |
| 3,534,755 A * | 10/1970 | Urbanosky | F15C 1/146 |
| | | | 137/816 |
| 3,587,613 A | 6/1971 | Mark | |
| 3,744,376 A | 7/1973 | Carpenter | |
| 4,923,057 A * | 5/1990 | Carlson et al. | 188/378 |
| 4,930,463 A | 6/1990 | Hare, Sr. | |
| 5,099,884 A | 3/1992 | Monahan | |
| 5,142,775 A * | 9/1992 | Wiley | 29/852 |
| 5,158,109 A * | 10/1992 | Hare, Sr. | 137/514.3 |
| 5,161,653 A | 11/1992 | Hare, Sr. | |

(Continued)

OTHER PUBLICATIONS

Yoshida et al., Fabrication of Micro Electro-rheological Valves (ER valves) by Micromachining and Experiments, Sensors and Actuators A 95, Elsevier Science B.V., 2002, pp. 227-233.

(Continued)

*Primary Examiner* — Craig Schneider
*Assistant Examiner* — Minh Le
(74) *Attorney, Agent, or Firm* — McDonnell Boehnen Hulbert & Berghoff LLP

(57) ABSTRACT

A printed circuit board electrorheological fluid valve and method with spaced, bonded, epoxy printed circuit board laminates defining flow channels therebetween. Electrodes are formed on opposite surfaces of the flow channels and surface pads on a laminate are electrically connected to the electrodes for applying a voltage thereto controlling the flow of electrorheological fluid in the flow channels.

25 Claims, 23 Drawing Sheets

(56) References Cited

U.S. PATENT DOCUMENTS

| | | |
|---|---|---|
| 5,241,991 A | 9/1993 | Iorio et al. |
| 5,315,961 A | 5/1994 | Wichelhaus |
| 5,346,372 A | 9/1994 | Naruse et al. |
| 5,460,680 A * | 10/1995 | Yamaguchi et al. ......... 156/289 |
| 5,640,995 A | 6/1997 | Packard et al. |
| 5,717,423 A | 2/1998 | Parker |
| 5,986,884 A * | 11/1999 | Jairazbhoy et al. .......... 361/700 |
| 6,090,468 A * | 7/2000 | Shimada ............. H01L 21/4857 156/300 |
| 6,123,316 A | 9/2000 | Biegelsen et al. |
| 6,214,525 B1 * | 4/2001 | Boyko ................. H01L 21/486 216/18 |
| 6,378,558 B1 | 4/2002 | Pohl et al. |
| 6,626,416 B2 | 9/2003 | Sharma et al. |
| 6,700,177 B2 * | 3/2004 | Yoshisato ............... H01L 23/66 257/531 |
| 6,786,708 B2 * | 9/2004 | Brown et al. .............. 417/413.3 |
| 6,866,762 B2 | 3/2005 | Gascoyne et al. |
| 6,875,526 B2 * | 4/2005 | Umemoto et al. ......... 428/692.1 |
| 7,070,684 B1 | 7/2006 | Fuhr et al. |
| 7,298,047 B2 * | 11/2007 | Kawakami et al. .......... 257/758 |
| 7,350,296 B2 * | 4/2008 | Ryu ....................... H05K 1/185 174/260 |
| 7,589,714 B2 | 9/2009 | Funaki |
| 7,863,724 B2 * | 1/2011 | Douriet et al. .............. 257/691 |
| 7,923,124 B2 * | 4/2011 | Minegishi ............. F15B 13/081 137/833 |
| 7,939,032 B2 * | 5/2011 | Hanafusa .............. B01L 3/0293 422/500 |
| 7,975,723 B2 * | 7/2011 | Peeters et al. ................. 137/884 |
| 8,031,474 B2 * | 10/2011 | Ogawa et al. ................ 361/761 |
| 8,106,516 B1 * | 1/2012 | Lacap .................... H01L 23/50 257/666 |
| 8,134,082 B2 * | 3/2012 | Nakamura et al. ........... 174/256 |
| 8,141,240 B2 * | 3/2012 | Hiew et al. ...................... 29/836 |
| 8,202,496 B2 * | 6/2012 | Coiffic .................. B01D 61/28 209/634 |
| 8,245,390 B2 * | 8/2012 | McKinley et al. ............. 29/846 |
| 8,409,927 B1 * | 4/2013 | Yim ............... 438/113 |
| 8,446,003 B2 * | 5/2013 | Komura ............. H01L 23/3677 257/684 |
| 8,550,222 B2 | 10/2013 | Browne et al. |
| 8,574,513 B2 * | 11/2013 | Chen .................... H01L 23/473 422/50 |
| 8,642,896 B2 * | 2/2014 | Fukuzono ........... H01L 21/4857 174/260 |
| 8,973,613 B2 | 3/2015 | Murphy et al. |
| 2002/0021204 A1 * | 2/2002 | Pankow ................ H05K 1/167 338/308 |
| 2002/0100888 A1 | 8/2002 | Sharma et al. |
| 2003/0226604 A1 | 12/2003 | Schlautmann et al. |
| 2004/0234401 A1 | 11/2004 | Banister |
| 2005/0035952 A1 * | 2/2005 | Chen ....................... G06F 3/045 345/173 |
| 2007/0272436 A1 * | 11/2007 | Matsui ........................ 174/260 |
| 2008/0185704 A1 * | 8/2008 | Hsu ........................ H01L 24/19 257/690 |
| 2009/0044875 A1 | 2/2009 | Griss et al. |
| 2009/0159822 A1 | 6/2009 | Pattekar et al. |
| 2009/0207568 A1 * | 8/2009 | Haveri .................. H01L 23/473 361/699 |
| 2010/0059122 A1 | 3/2010 | Peeters et al. |
| 2010/0065321 A1 * | 3/2010 | Kashiwakura ....... H05K 1/0222 174/261 |
| 2010/0120130 A1 | 5/2010 | Srinivasan et al. |
| 2010/0163414 A1 | 7/2010 | Gillies et al. |
| 2010/0236928 A1 | 9/2010 | Srinivasan et al. |
| 2010/0252117 A1 | 10/2010 | Pattekar et al. |
| 2010/0282609 A1 | 11/2010 | Pollack et al. |
| 2011/0262710 A1 | 10/2011 | Sinha |
| 2011/0300034 A1 * | 12/2011 | Mair ................. B29C 66/92443 422/502 |
| 2012/0273053 A1 * | 11/2012 | Murphy et al. ................. 137/13 |
| 2012/0285550 A1 | 11/2012 | Pattekar et al. |
| 2013/0208434 A1 * | 8/2013 | Alm ........................ 361/783 |
| 2013/0294041 A1 * | 11/2013 | Syal ..................... H05K 1/0275 361/764 |
| 2013/0327565 A1 * | 12/2013 | Qu ................................. 174/266 |
| 2014/0251807 A1 | 9/2014 | Shenderov |

OTHER PUBLICATIONS

Adams et al., "Industrial Applications of ERF-Technology," Fludicon, Fluid Digital Control, Fludicon, GmbH, Landwehstr, Darnstadt, Germany, pp. 1-5.

Han, Y-M et al., "Performance comparison of electrorheological valves with two different geometric configurations: cylinder and plate," Proc. IMechE vol. 223 Part C: J. Mechincal Engineering Science, 2009, pp. 573-581.

Zaun, Michael, "Design of Cylinder Drives Based on Electrorheological Fluids," International Journal of Fluid Power, 2006, pp. 7-13, vol. 7, No. 1.

Murphy et al., U.S. Appl. No. 14/618,670, filed Feb. 10, 2015, 28 pages.

* cited by examiner

PRINTED CIRCUIT BOARD ELECTRORHEOLOGICAL FLUID VALVE

FIELD OF THE INVENTION

The invention relates to electrorheological fluid valves.

BACKGROUND OF THE INVENTION

For hydraulic control mechanisms, electrorheological fluid valves have been developed. A typical electrorheological fluid valve includes two spaced electrodes forming a fluid channel. An electric potential between the electrodes causes an electric field in the flow channel increasing the viscosity of the electrorheological fluid valve therein.

The uniformity and repeatability of the electrode gap is important. For robotic applications, small size, inexpensive valves are needed. In U.S. Pat. No. 5,099,884, incorporated herein by this reference, "channel plates" alternate with printed circuit board "electrode plates" clamped together using tie rods.

Yoshida et al. "Fabrication of Microelectrode-Rheological Valves (ER valves) by Micromachining and Experiments", Sensor and Actuators A 95 (2002) 227-233, also incorporated herein by this reference, proposes a "microvalve" fabricated by micromachining techniques.

SUMMARY OF THE INVENTION

A new electrorheological fluid valve is manufactured using printed circuit board assembly techniques resulting in a small, printed circuit board electrorheological fluid valve with multiple flow channels therethrough and also electrical interconnects so the electrodes of the valve can be controlled by circuits of and electronic components mounted to the printed circuit board itself.

The result is an electrorheological fluid valve which is inexpensive to produce in quantity, which can utilize printed circuit board design software, which exhibits excellent uniformity in a bonded laminate structure which holds high pressure without fasteners or clamps and without leaking. A further beneficial result is an electrorheological fluid valve which has a low volume and weight and which may have integrated internal wiring.

Featured in one embodiment is a printed circuit board electrorheological fluid valve comprising spaced, bonded, epoxy printed circuit board laminates defining flow channels therebetween. Electrodes are formed on the laminates on opposite surfaces of the flow channel. Surface pads are on a laminate and electrically connected to the electrodes for applying a voltage thereto controlling the flow of electrorheological fluid in the flow channels.

In one design, there are vias electrically connecting select electrodes and a pad electrically connected to each via. Advantageously, the valve may further include one or more laminates with conductive traces and/or one or more electronic components. One or more laminates may even include multiple electrodes, e.g., multiple individually addressable electrodes.

In some versions, the flow channels extend from one edge of the printed circuit board to another portion of the printed circuit board. There can even be a port in a face of the printed circuit board fluidly connected to one or more of the flow channels and/or one or more edge ports fluidly connected to one or more flow channels. The flow channels may change direction laterally and/or vertically within the printed circuit board.

In one version, there is a top laminate and a bottom laminate and a plurality of internal spaced electrode laminates therebetween. There are spacer layer laminates between the internal electrode laminates.

In some designs, heat fins are included for removing heat from the flow channels. One or more mechanical features can also be fowled on the printed circuit board valve.

Also featured is a method of manufacturing a printed circuit board electrorheological fluid valve comprising assembling a layup including a plurality of laminates defining a plurality of electrodes and spacer layers forming flow channels, consolidating the layup using heat and pressure to bond the laminates together, and singulating individual printed circuit board electrorheological fluid valves from the consolidated layup. The method may further include forming vias connected to the electrodes and/or machining the consolidated layup to form one or more ports fluidly connected to the flow channels.

One method includes bonding spaced printed circuit board laminates with electrodes thereon to form a plurality of electrorheological flow channels forming surface pads and electrically connecting the surface pads to select electrodes. Bonding the spaced printed circuit board laminates preferably includes assembling a layup including a plurality of laminates defining a plurality of electrodes and spacer layers forming flow channels between the electrodes and consolidating the layup using heat and pressure to bond the laminates together. Electrically connecting the surface pads to select electrodes preferably includes forming vias interconnecting select surface pads and select electrodes.

The subject invention, however, in other embodiments, need not achieve all these objectives and the claims hereof should not be limited to structures or methods capable of achieving these objectives.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Figure 1:
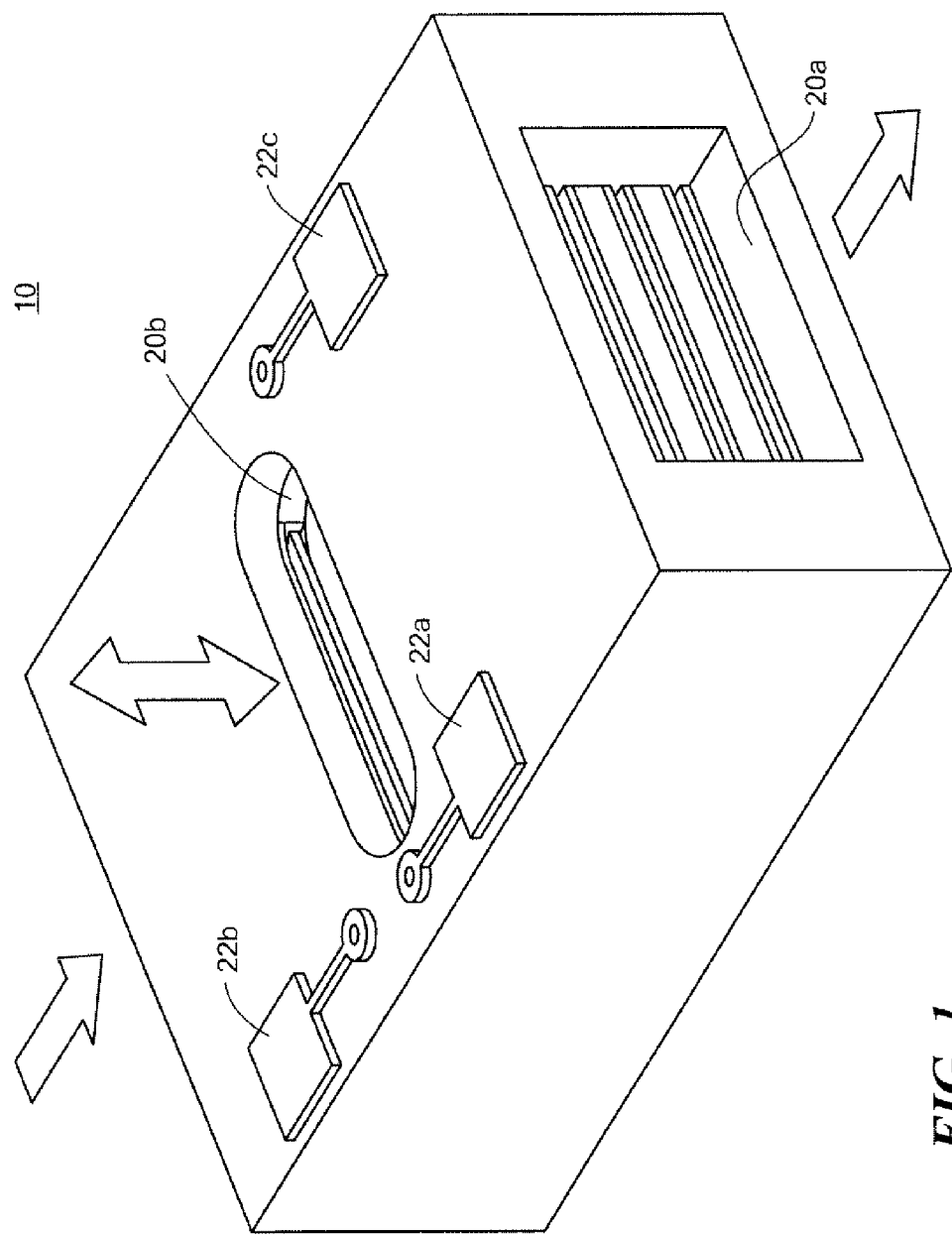
FIG. 1 is a schematic three dimensional front view showing an example of a printed circuit board electrorheological fluid valve in accordance with the invention.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

Figure 2:
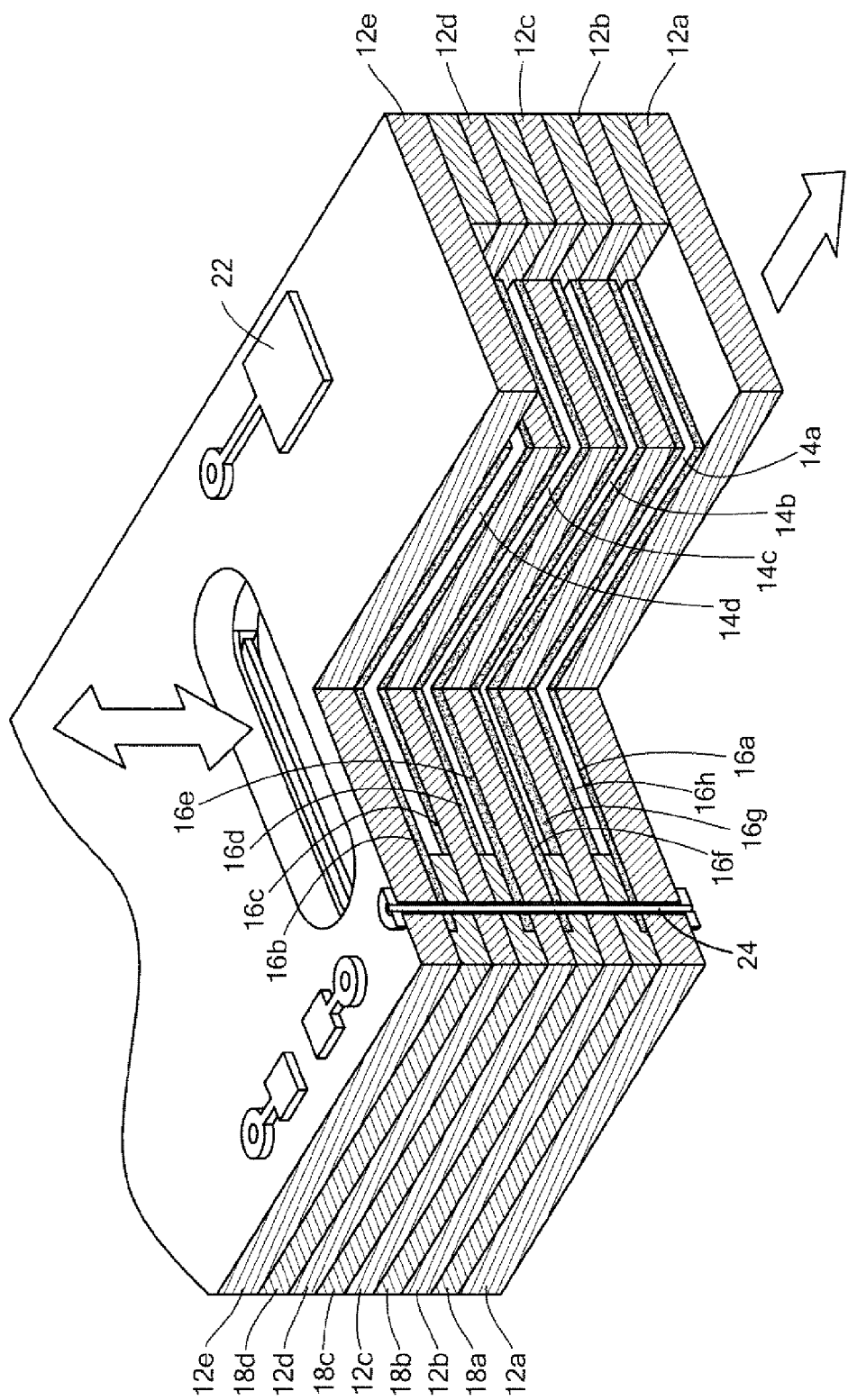
FIG. 2 is a schematic three dimensional partially cutaway view of the valve of FIG. 1.

FIGS. 1-2 show an example of printed circuit board electrorheological fluid valve 10. Epoxy based printed circuit board laminates 12a-12e are spaced from each other and thus define flow channels 14a, 14b, 14c, and 14d. Bottom laminate 12a has a top surface electrode 16a and top laminate 12e has a bottom surface electrode 16b. Laminates 12b, 12c, and 12d each have both top and bottom surface electrodes (16e-16h) as shown and thus each flow channel includes opposite surface spaced electrodes. Between electrode laminates 12 are spacer layer laminates 18a, 18b, 18c, and 18d in the layup which, before consolidation, preferably include B stage and/or C stage FR4 material. Laminates 12c-12e, in contrast, are typically C stage FR4 material with electrodes already formed thereon. Each electrode laminate may include multiple electrodes in some examples. In one example, the spacer laminates include a 0.005" thick C stage filler layer sandwiched between 0.0025" thick B stage/prepreg layers.

In FIGS. 1-2, two fluid ports are shown, ports 20a and 20b which fluidly communicate with the internal flow channels. The other port is at the rear of the structure. Fittings can thus be coupled to the ports. The ports can be formed using preconfigured laminates defining one or more ports and/or by post consolidation machining processes. Also, surface pads 22a, 22b, and 22c are electrically connected to select electrodes through vias such as plated via 24, FIG. 2 which is physically and thus electrically connected to electrodes 16b, 16e, 16f, and 16a which may be "ground" electrodes. Another via is connected to pad 22c and the opposing electrodes 16c, 16d, 16g, and 16h of each flow channel and thus a voltage applied across pads 22a and 22c controls the flow of electrorheological fluid in the flow channels 14a, 14b, and 14c, and 14d. By adding additional pads, vias, and/or other interconnects, the flow in individual channels can be controlled.

In FIG. 1, the flow through each of the two valve sections can be controlled and/or any one valve sections can be "closed" while the other can be "open". In this particular design, the valve is formed as a half bridge in order to drive a one-sided hydraulic actuator but full bridge or multiple full or half bridge designs are possible to drive multiple actuators. In a more simple design, there is simply one inlet and one outlet formed with or without a port.

Figure 3:
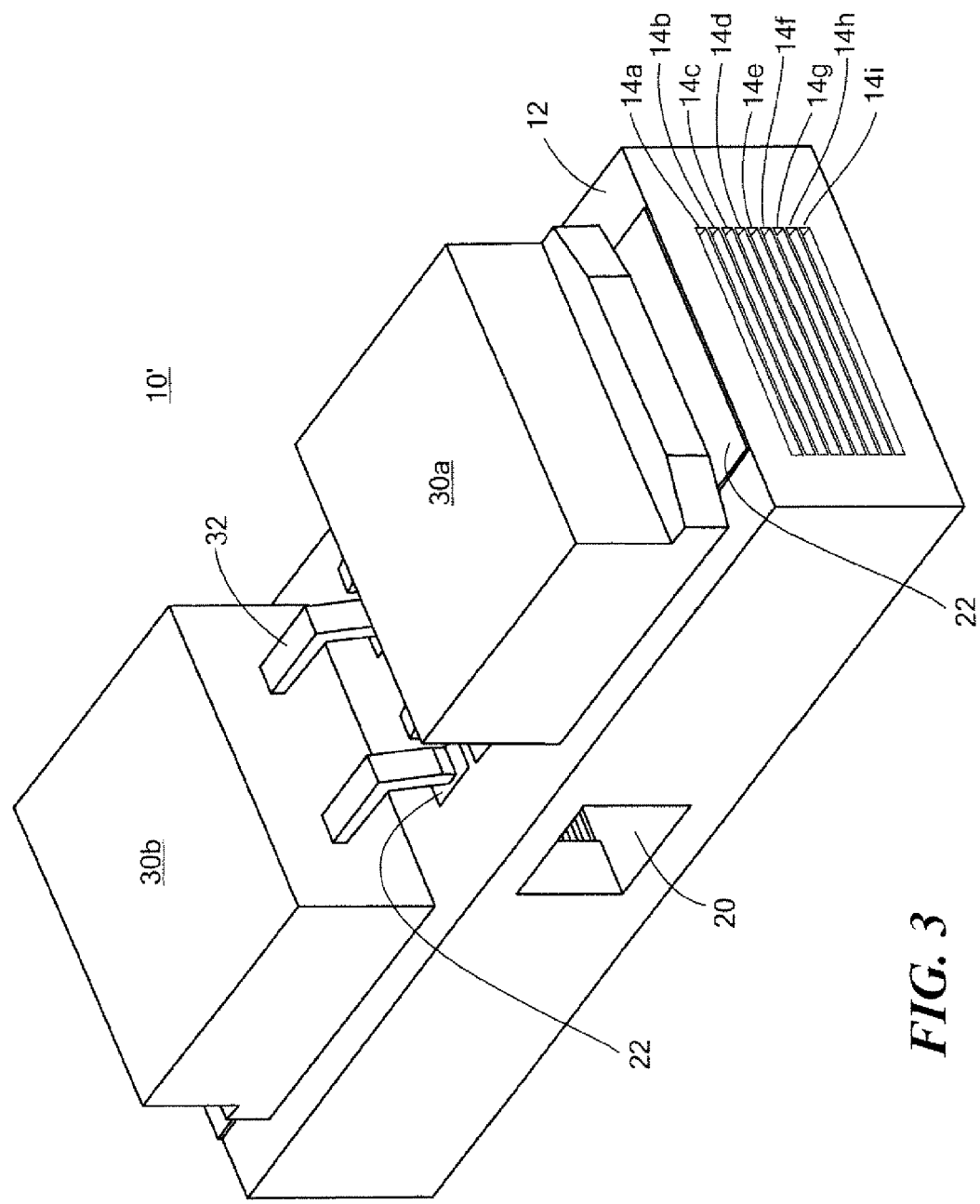
FIG. 3 is a schematic three dimensional front view showing another example of a printed circuit board electrorheological fluid valve in accordance with the invention.

FIG. 3 shows printed circuit board 10' now with edge port 20 in fluid communication with internal flow channels 14a-14i. Also, top laminate 12 includes conductive traces thereon and/or therein and bond pads, lands, and the like for electronic circuit control chips 30a and 30b physically secured to printed circuit board 10' and electrically connected to its circuitry via, for example, soldered pins as shown at 32. In this way, the electronic circuitry for the valve is on or in a component of a printed circuit board which also functions as the valve itself.

The result in one preferred embodiment is the ability to produce numerous valves in quantity using printed circuit board design software. Uniformity is excellent and the bonded laminate structure holds high pressure without any leakage and without the need for fasteners or clamping and the like. The valve can be made to have a low volume and weight since the flow channels comprises the majority of the valve volume. The printed circuit board can have integrated internal wiring, discrete electronics can be added into or on to the structure and very small feature/package sizes are possible.

Figure 4:
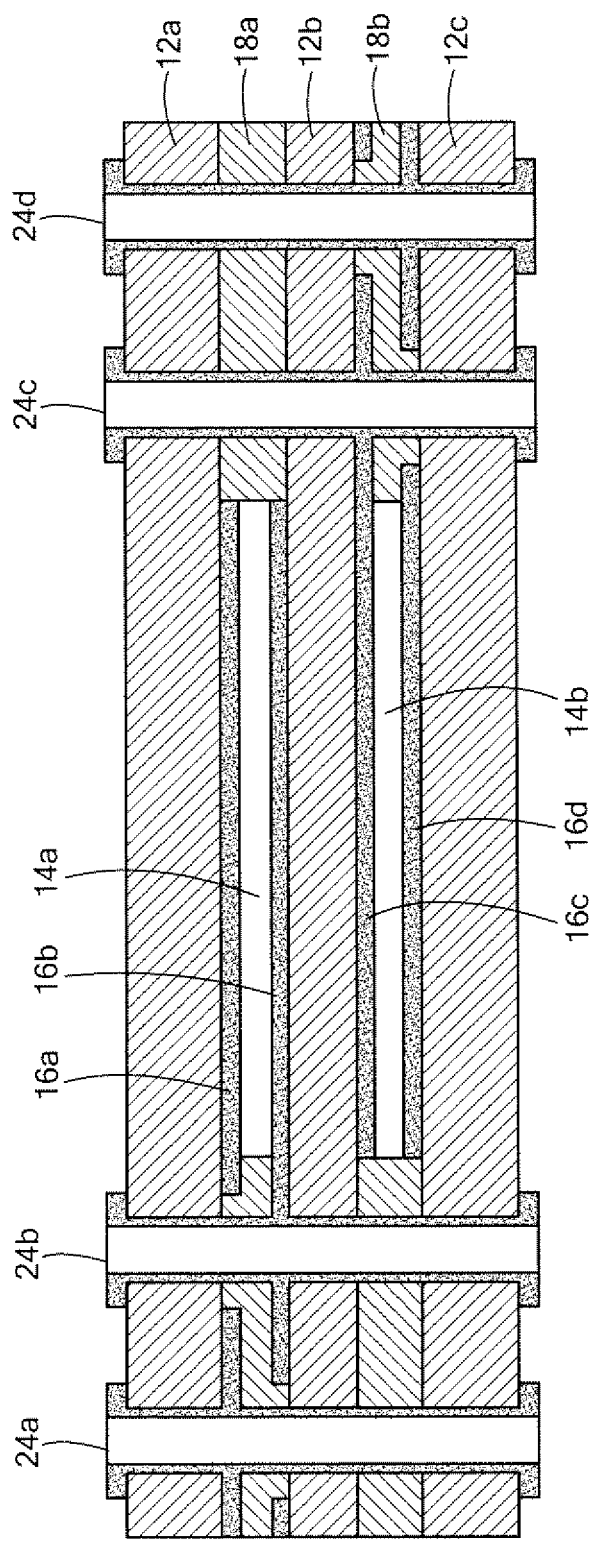
FIG. 4 is a schematic cross sectional view showing another configuration for a printed circuit board electrorheological fluid valve in accordance with examples of the invention.

Because printed circuit board manufacturing techniques are employed, multiple valves are fabricated at once and numerous features, structures, and/or configurations are possible. For example, in FIG. 4, electrodes 16a, 16b, 16c, and 16d are individually addressable via plated vias 24a, 24b, 24c, and 24d, respectively. Thus, the flow in the flow channel 14a can be regulated independently of the flow in channel 14b.

Figure 5:
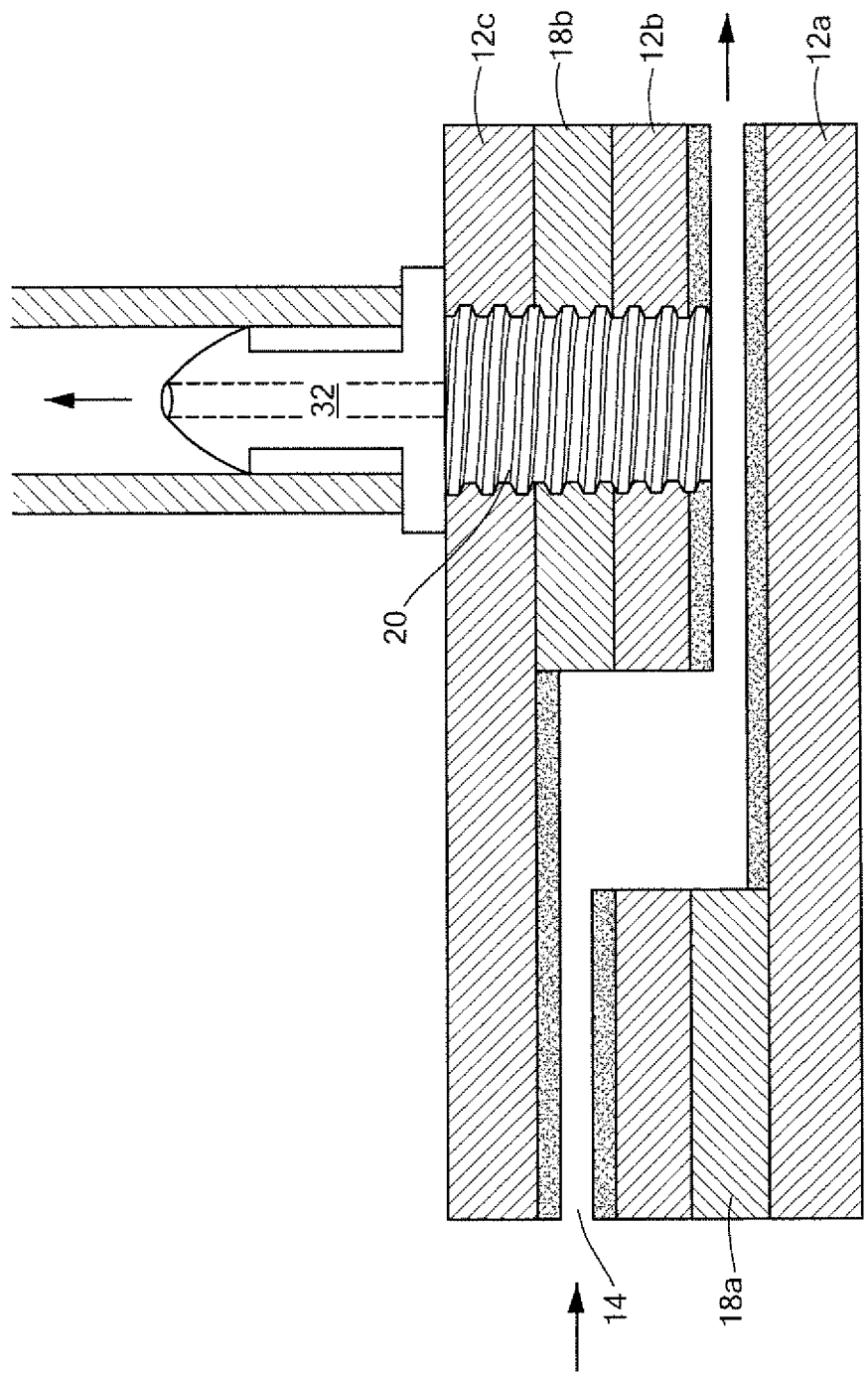
FIG. 5 is a cross sectional view showing still another example of an architecture for a printed circuit board electrorheological fluid valve in accordance with examples of the invention.

FIG. 5 shows flow channel 14 which changes directions vertically. Flow channels which internally change direction laterally are also possible. FIG. 5 also shows drilled and threaded port 20 fluidly connected to channel 14 for mechanical threaded nozzle fitting 32. In a similar manner, the laminate structure can be formed with various mechanical features for connecting fluid ports, with anchoring devices for snapping the valve onto other components, for kinematically locating the valve, and the like.

Figure 6:
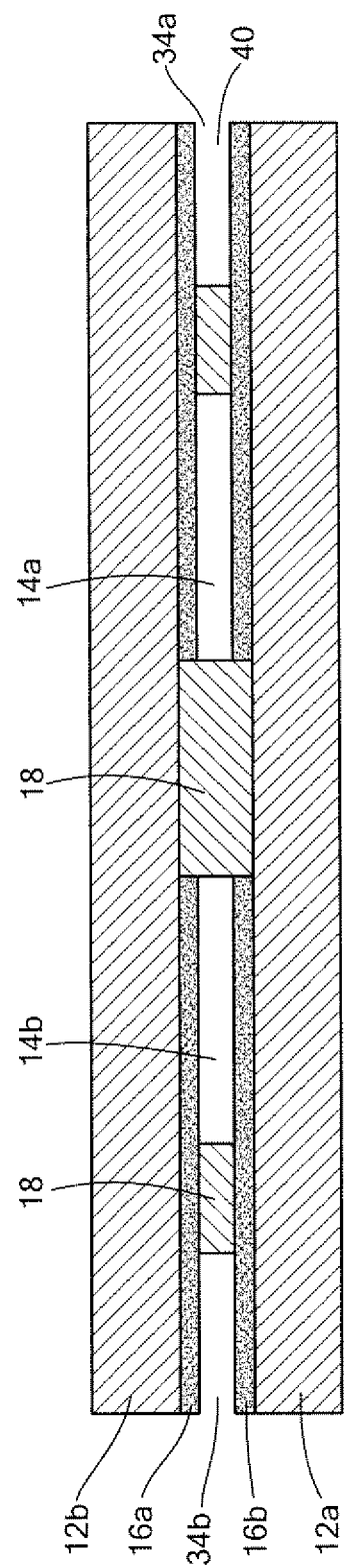
FIG. 6 is a schematic cross sectional view of a portion of a printed circuit board electrorheological fluid valve with heat transfer fins.

FIG. 6 shows edge heat dissipation fins 34a and 34b for flow channels 14a and 14b, respectively. The space between fins forms an airflow channel 40 between two spaced electrodes 16a, 16b which conduct heat out of the fluid in the fluid flow channels 14a, 14b to dissipate in the air. Thus, a number of features and configurations are possible.

Figure 7A:
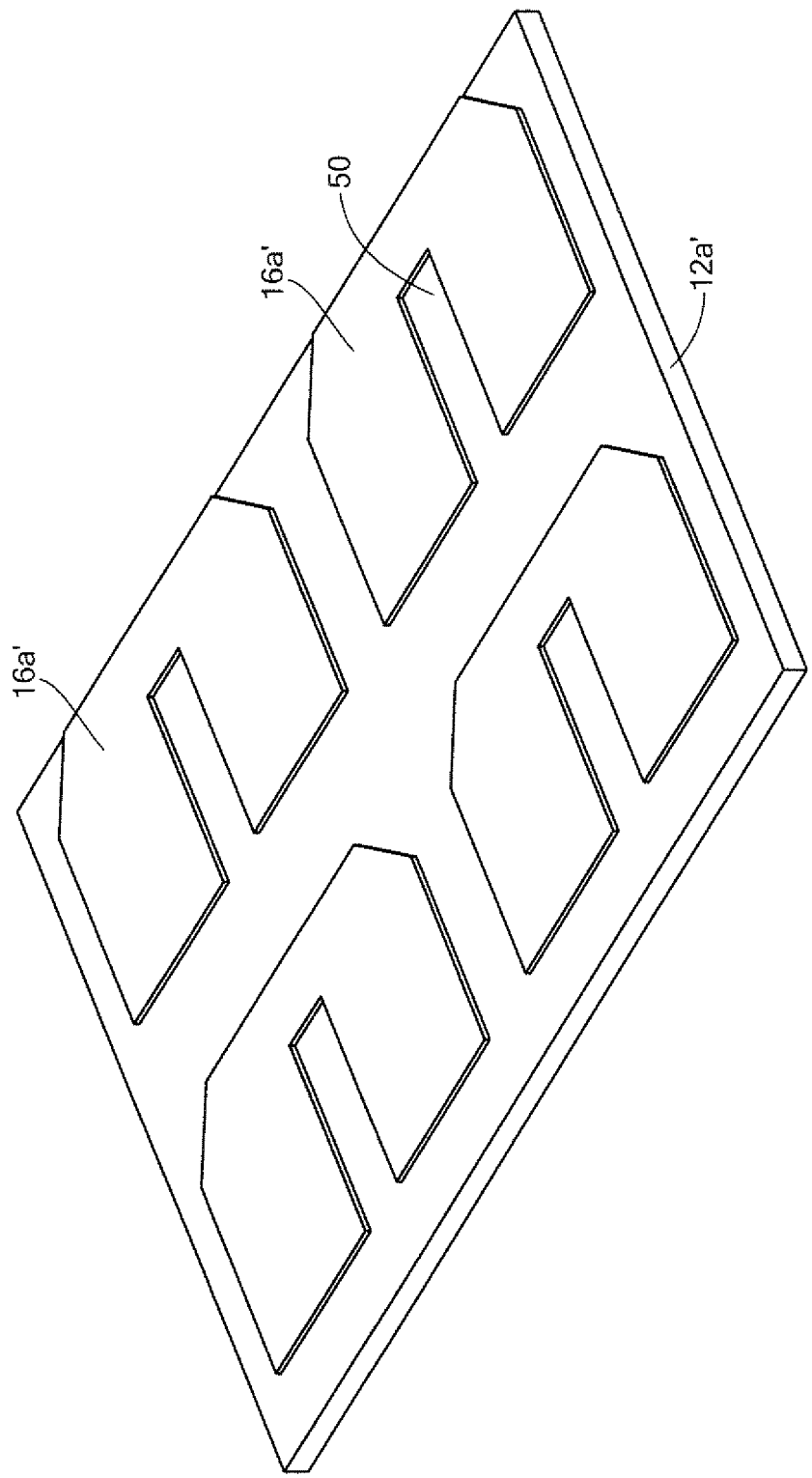
FIG. 7A-7P are schematic views showing an example of a method of manufacturing a printed circuit board electrorheological fluid valve in accordance with the invention.
Figure 7B:
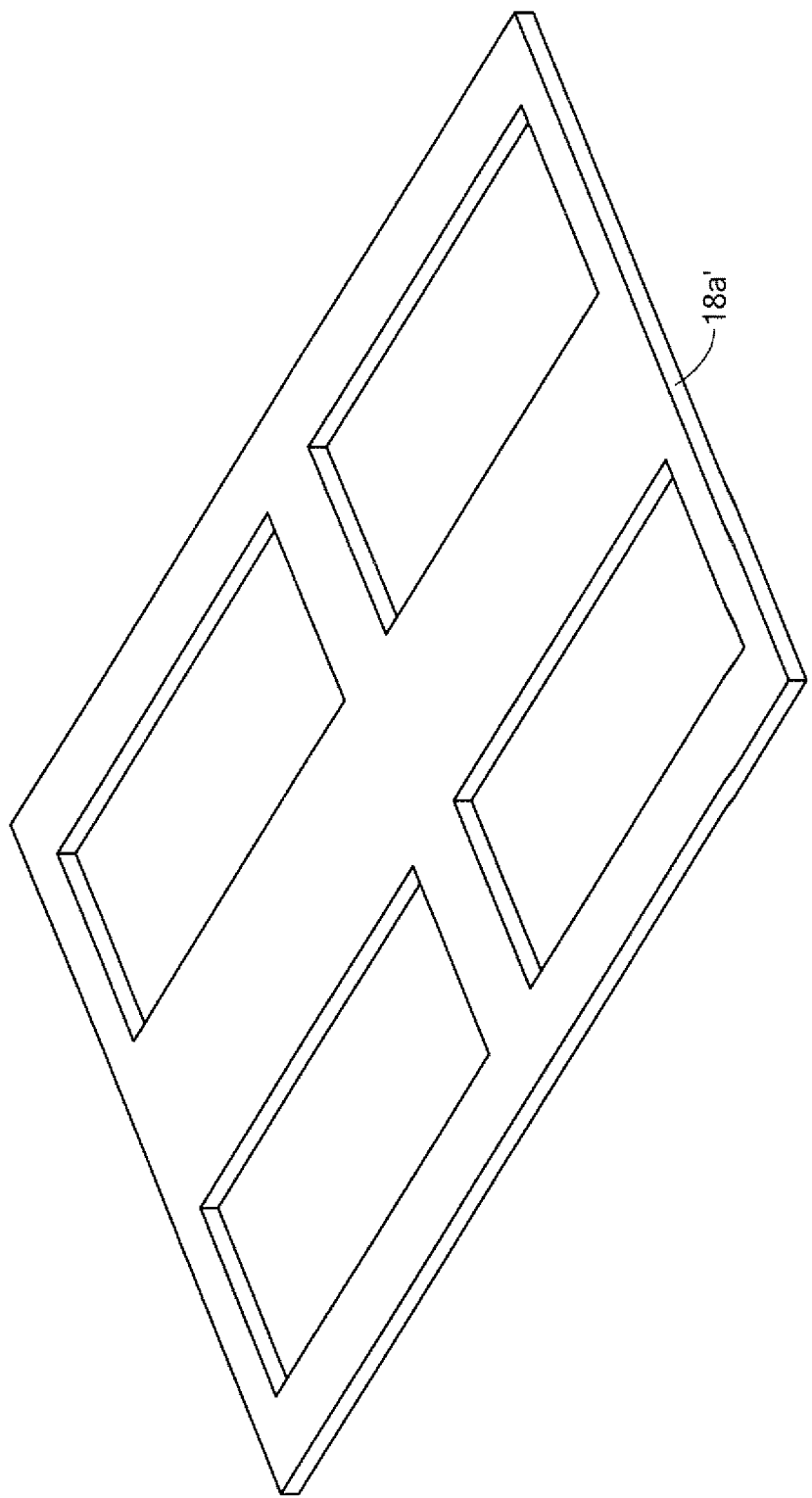
Figure 7C:
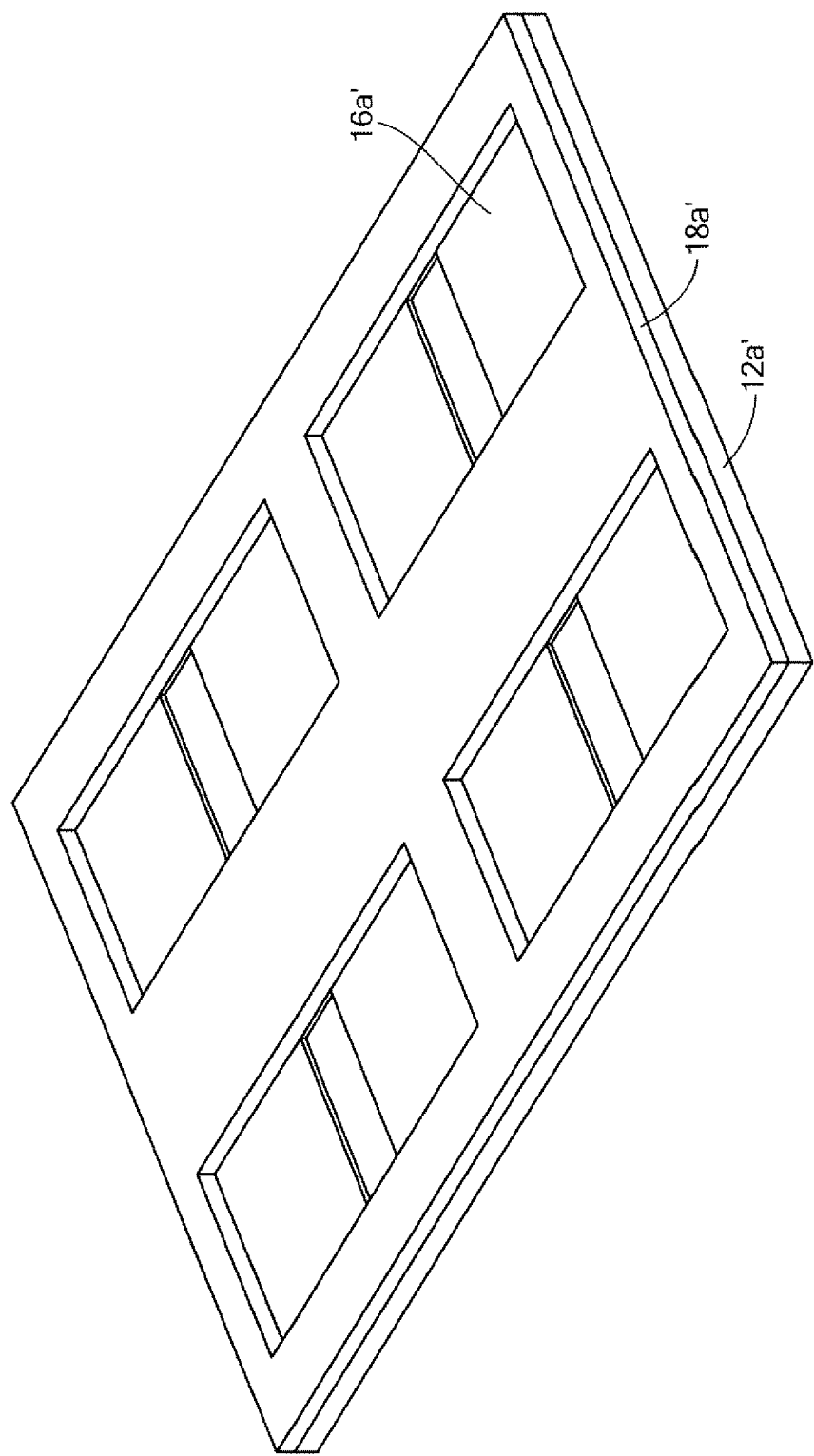
Figure 7D:
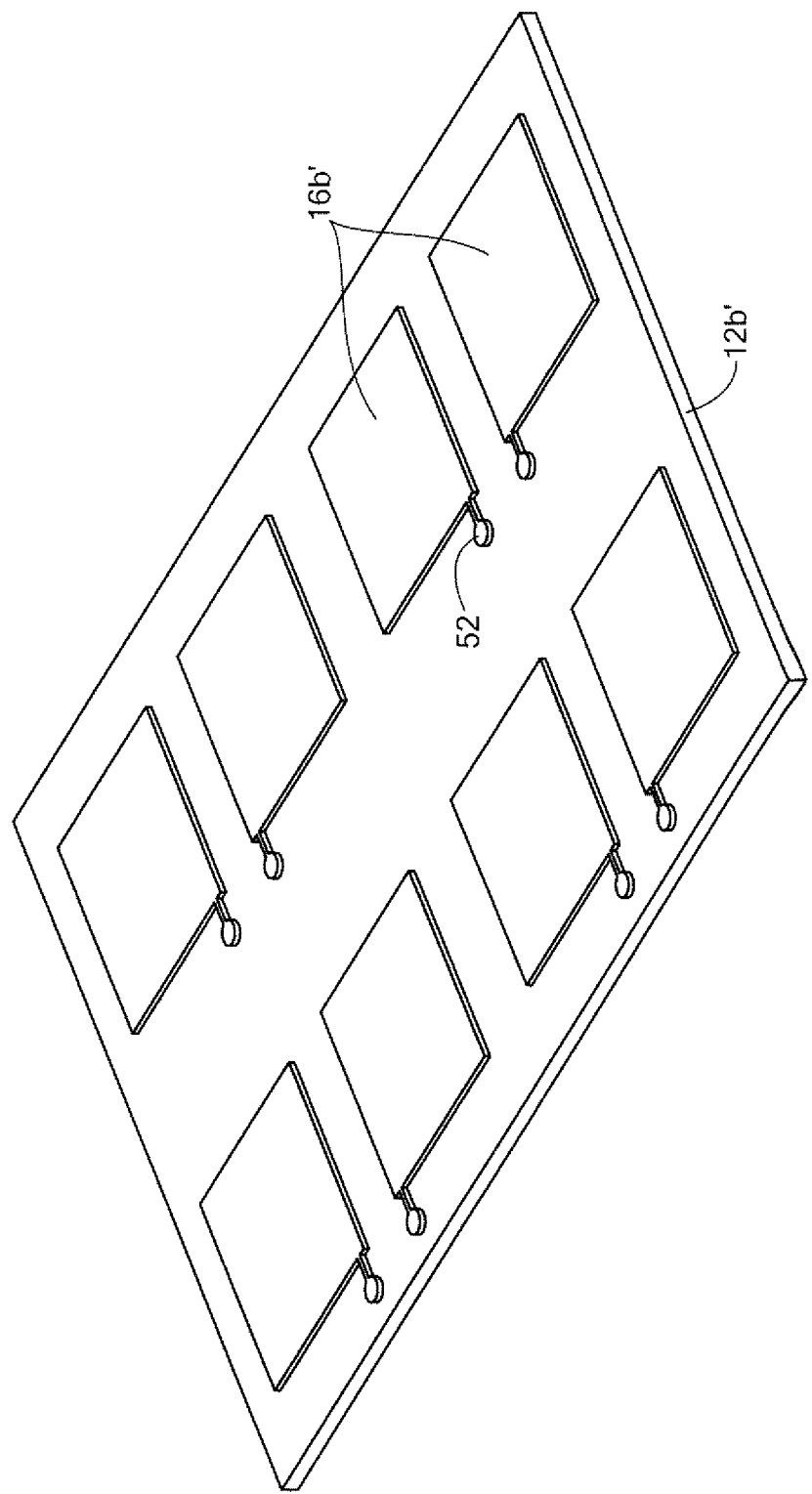
Figure 7E:
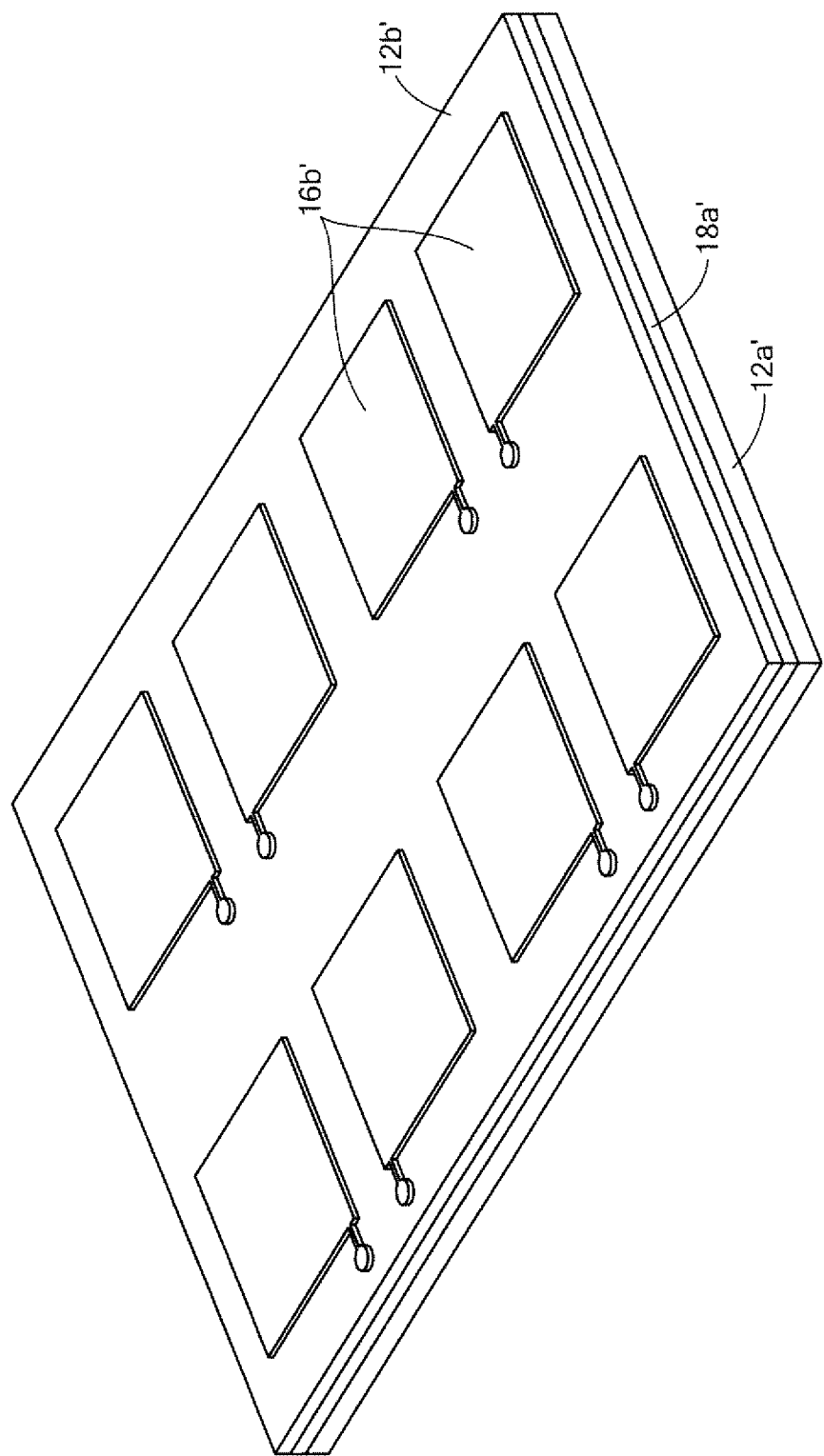
Figure 7F:
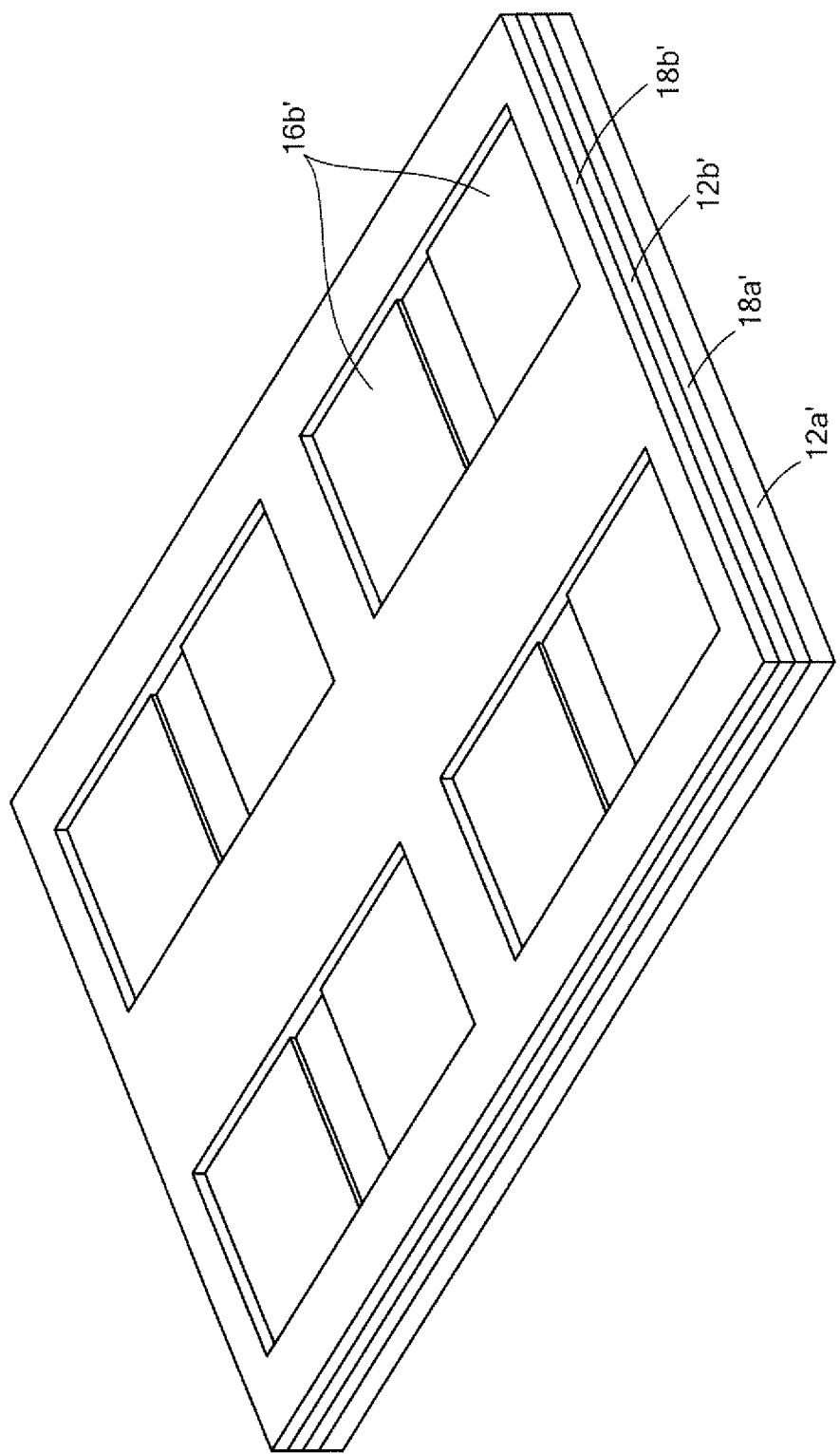
Figure 7G:
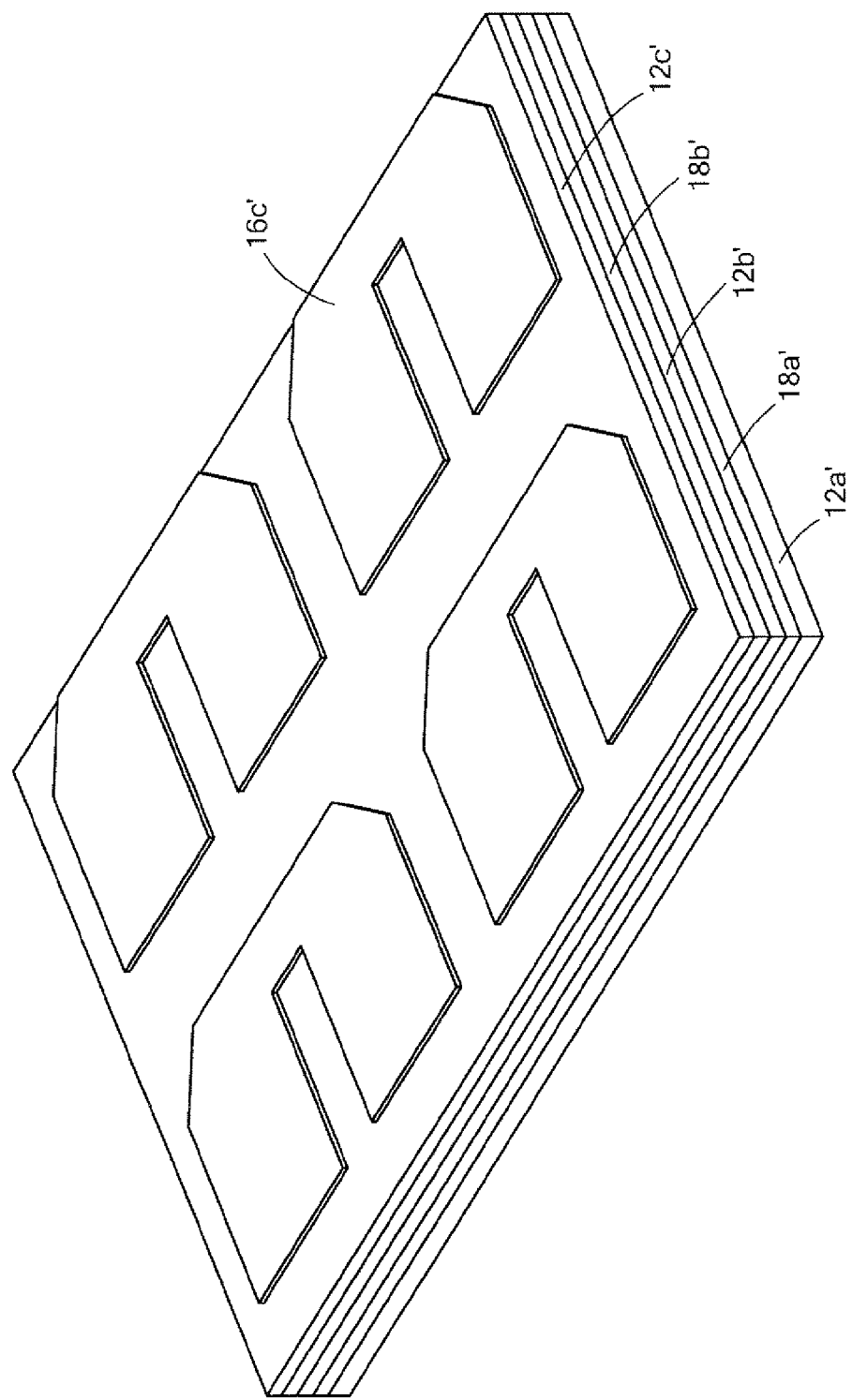
Figure 7H:
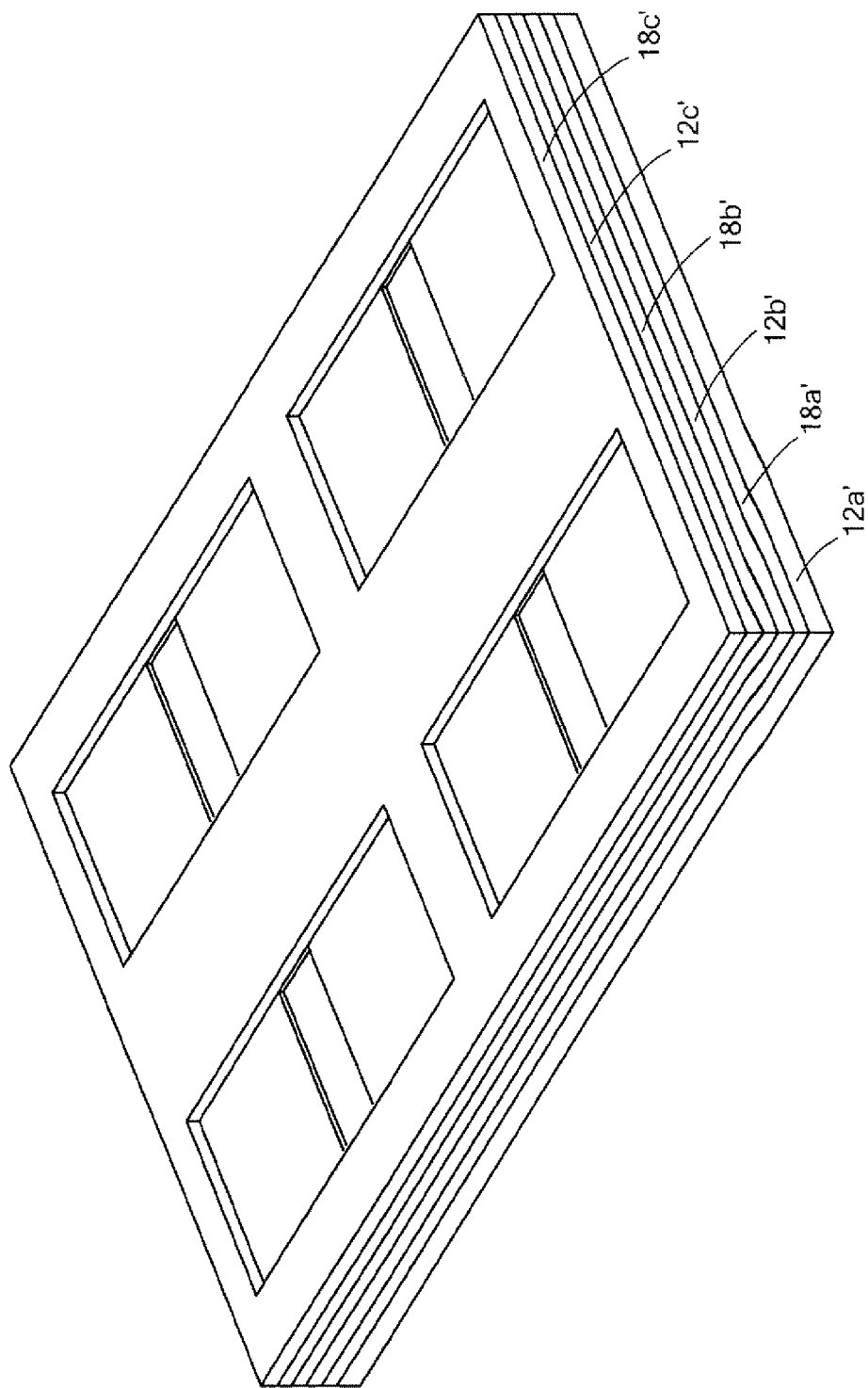
Figure 7I:
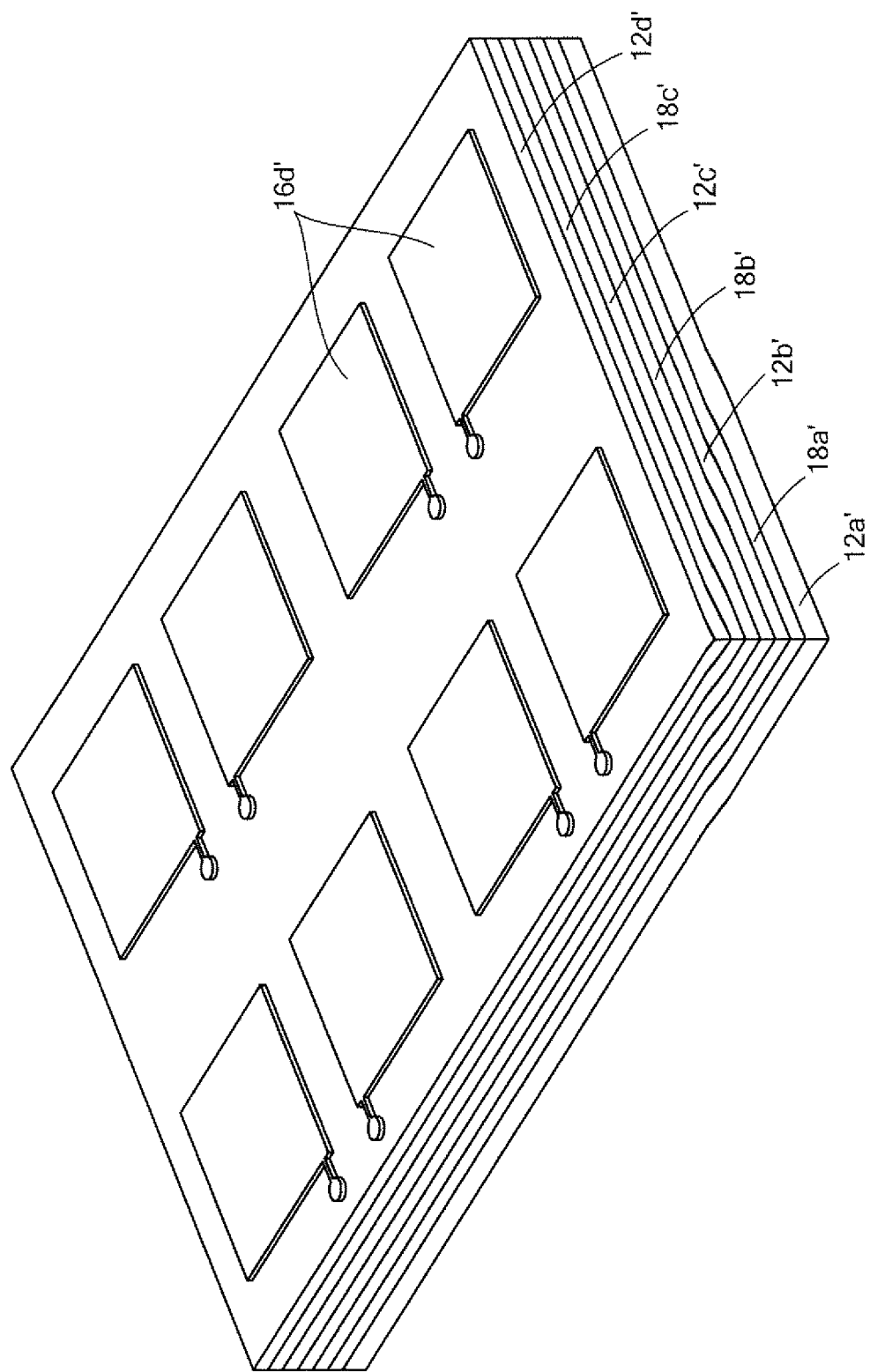
Figure 7J:
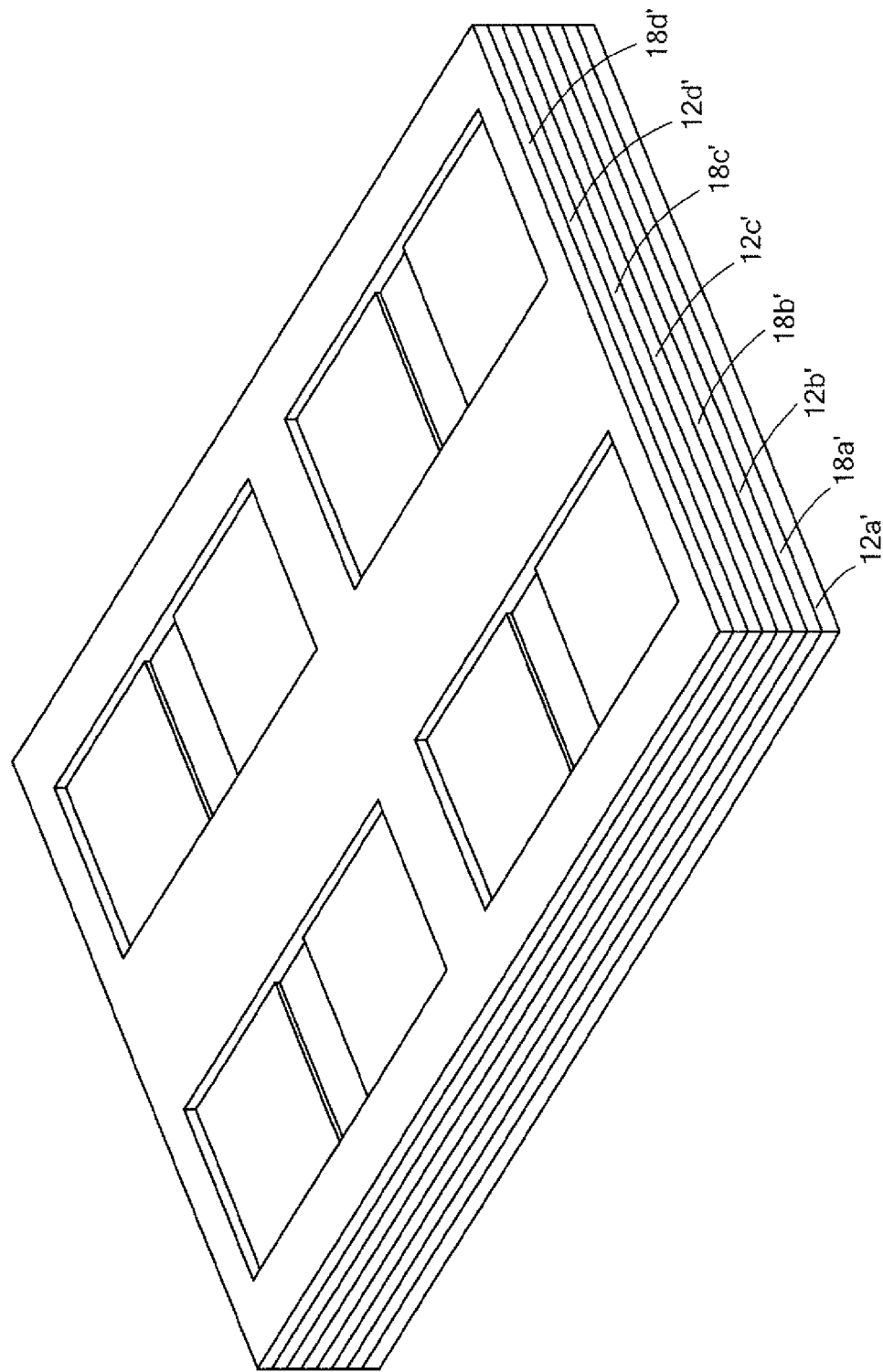
Figure 7K:
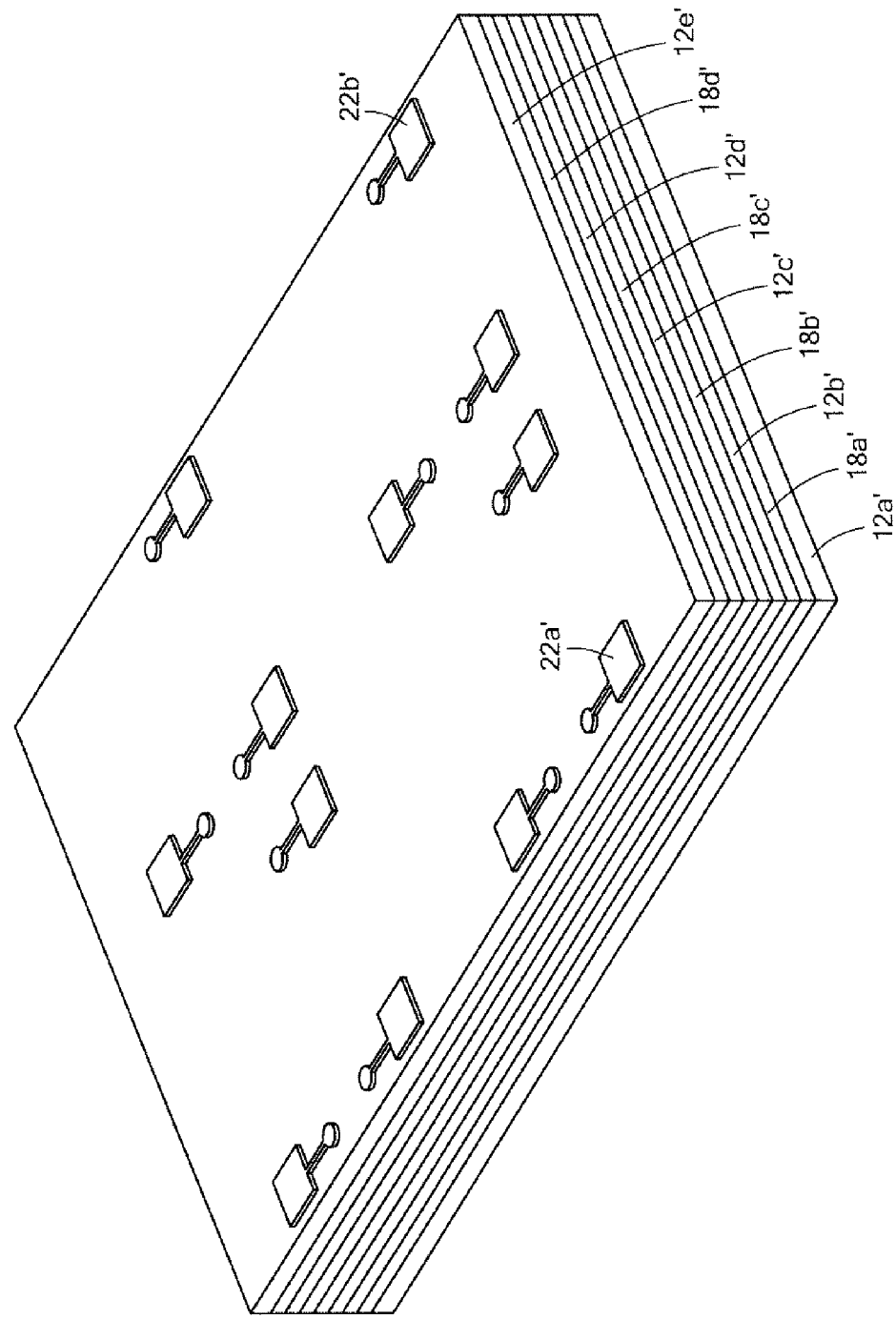
Figure 7L:
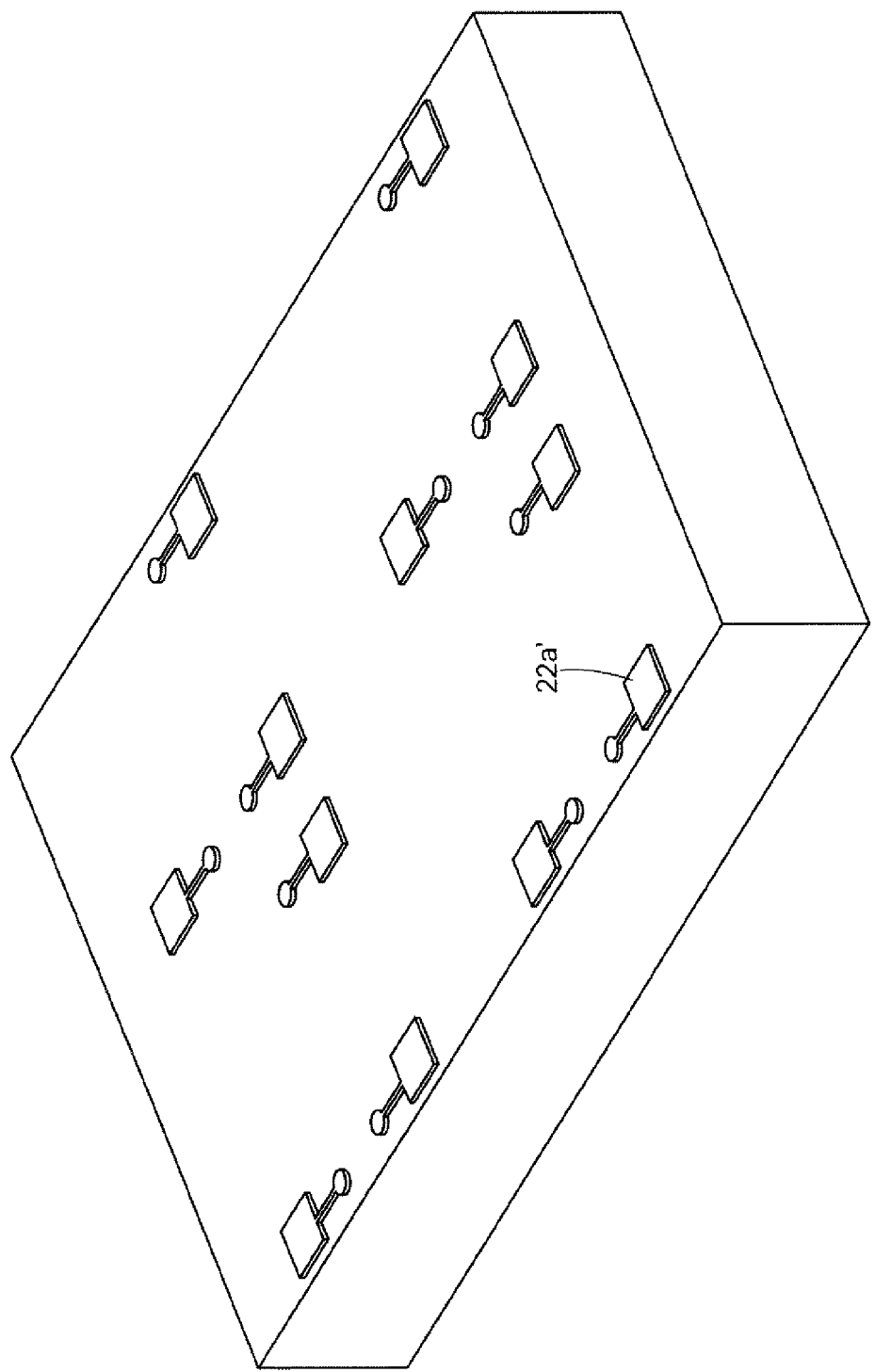
Figure 7M:
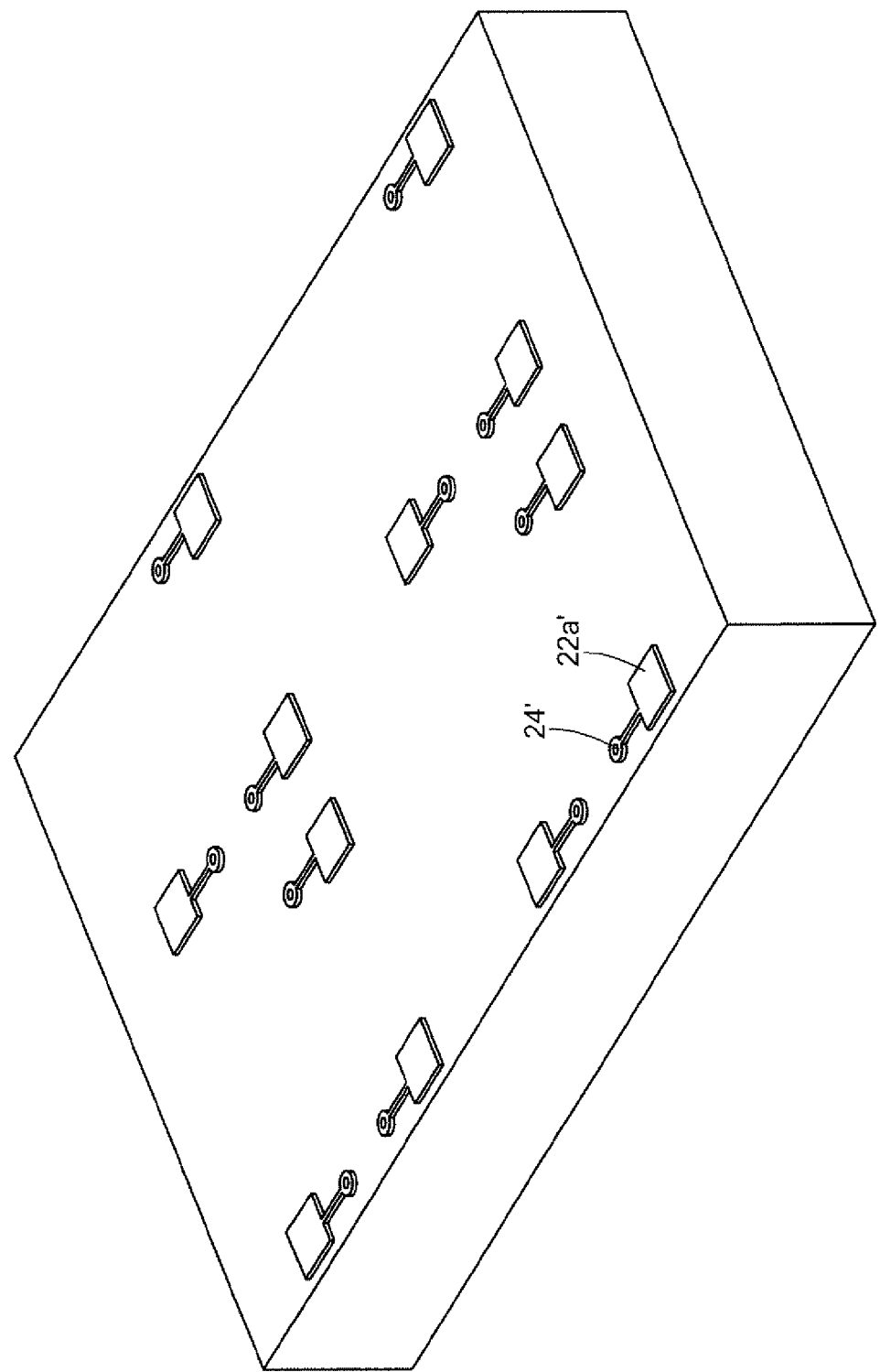
Figure 7N:
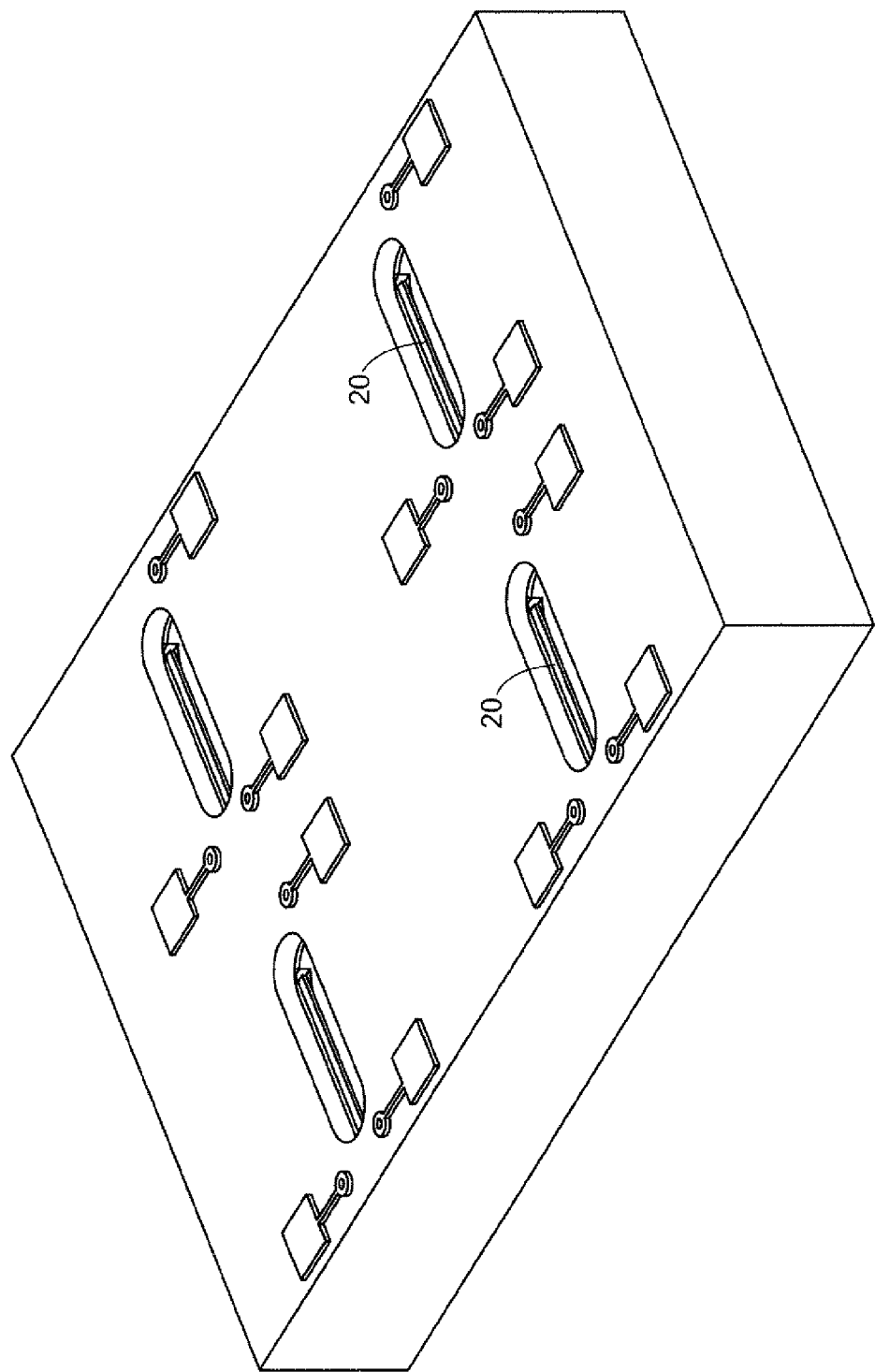
Figure 7O:
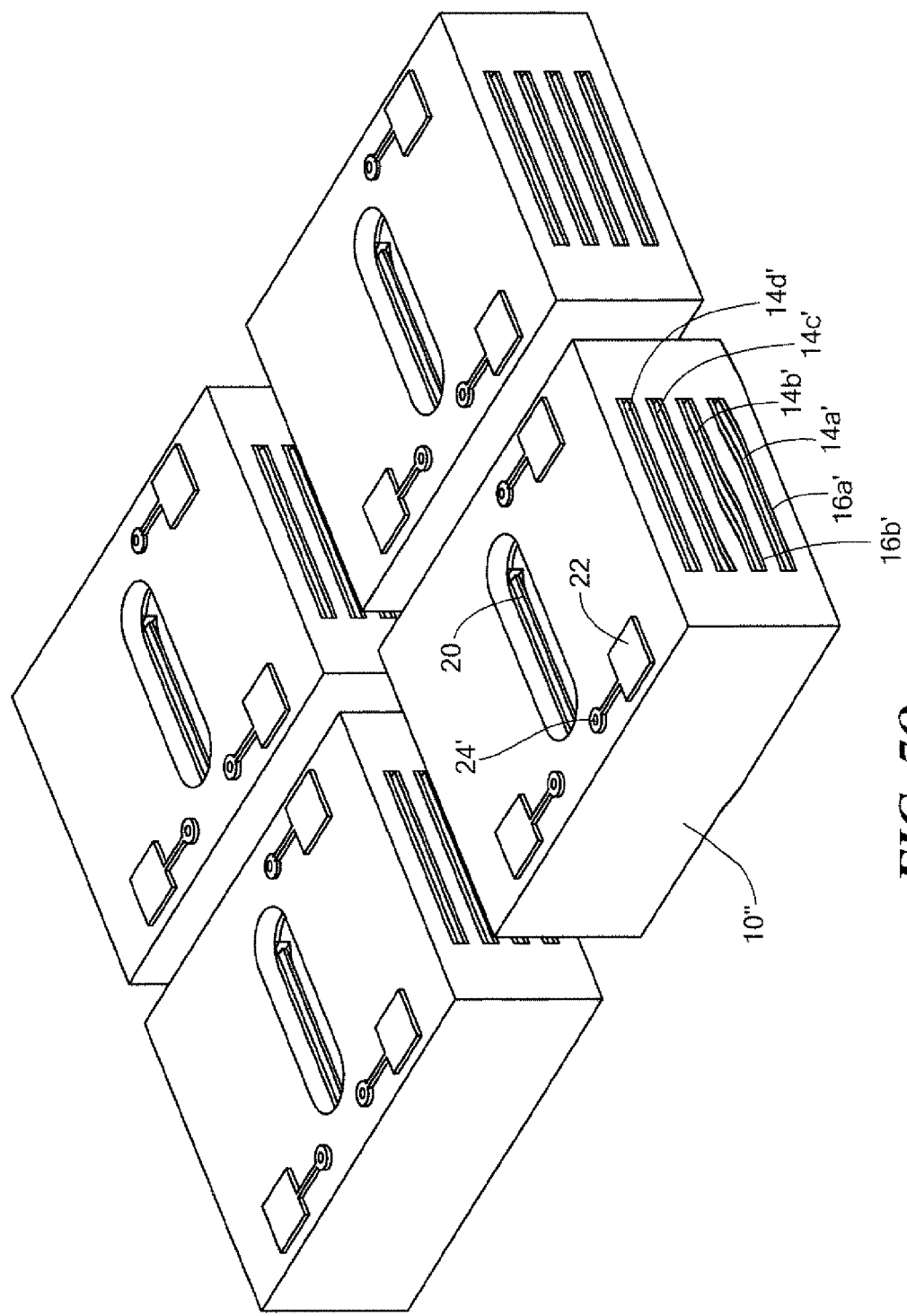
Figure 7P:
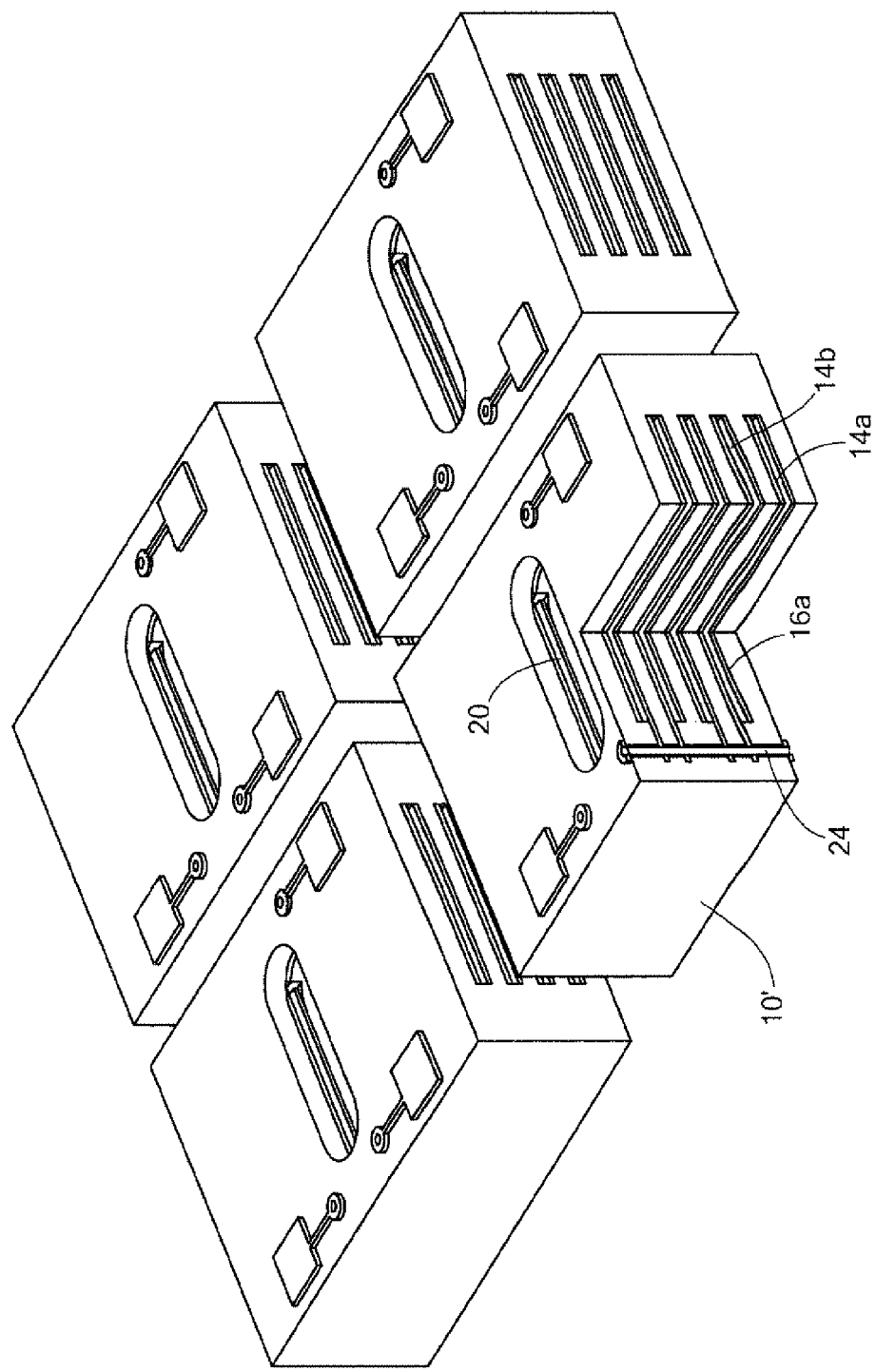

FIGS. 7A-7P depict various steps associated with manufacturing an electrorheological fluid valve in accordance with examples of the invention. FIG. 7A shows a beginning of the layup process with electrode laminate 12a including a number of formed top surface electrodes 16a' in an array. Electrodes on a laminate can be formed using subtractive processes and the electrode laminates can be procured from circuit board manufactures, assemblers, and the like. Here, each electrode 16a' includes cutout portion 50 configured for the formation of a later formed top port explained below. FIG. 7B shows spacer laminate 18a' (for example, a B stage or prepreg laminate material) and FIG. 7C shows spacer laminate 18a' disposed on top of bottom electrode laminate 12a?. FIG. 7D shows another electrode laminate 12b' and its array of electrodes 16b' each including a circular pad 52 configured for the formation of a later formed via explained below and FIG. 7E shows electrode laminate 12b' now located on spacer laminate 18a' while FIG. 7F shows another spacer laminate added at 18b' and FIG. 7G shows another electrode laminate 12c' now added to the layup. This process continues as shown in FIG. 7H-7J and it is understood that electrode laminates 12b', 12c', and 12d' have electrodes on their top and bottom surfaces although only the top surface electrodes are shown in the figures. In FIG. 7K, the top electrode laminate is applied to the layup and it includes an array of bottom surface electrodes as discussed previously. On the top surface of top electrode laminate 12e', solder pads 22a', 22b' and the like are formed electrically connected to a circular pad for a future formed via as shown. Robotic handlers and the like can be used to form the layup.

In FIG. 7L, the layup has now been consolidated using heat and pressure in accordance with printed circuit board fabrication processes and in FIG. 7M the vias, as necessary, are drilled and plated as shown at 24'. In this stage, all internal electrodes are protected (not exposed) to the plating chemical bath. In FIG. 7N, ports are routed or otherwise machined (e.g., a controlled depth drill and/or rout). as shown at 20 and in FIG. 7O the individual printed circuit board electrorheological fluid valves 10" are singulated which exposes the flow channels as shown on the front (and rear) of the valve. It is to be understood that in a traditional printed circuit board manufacturing run, hundreds or more valves would be created at the same time as opposed to the four shown for simplicity sake in FIG. 7. FIG. 7P shows a partially cutaway version for one valve showing plated via 24 and the interconnections it makes with alternating flow channel electrodes.

Figure 8:
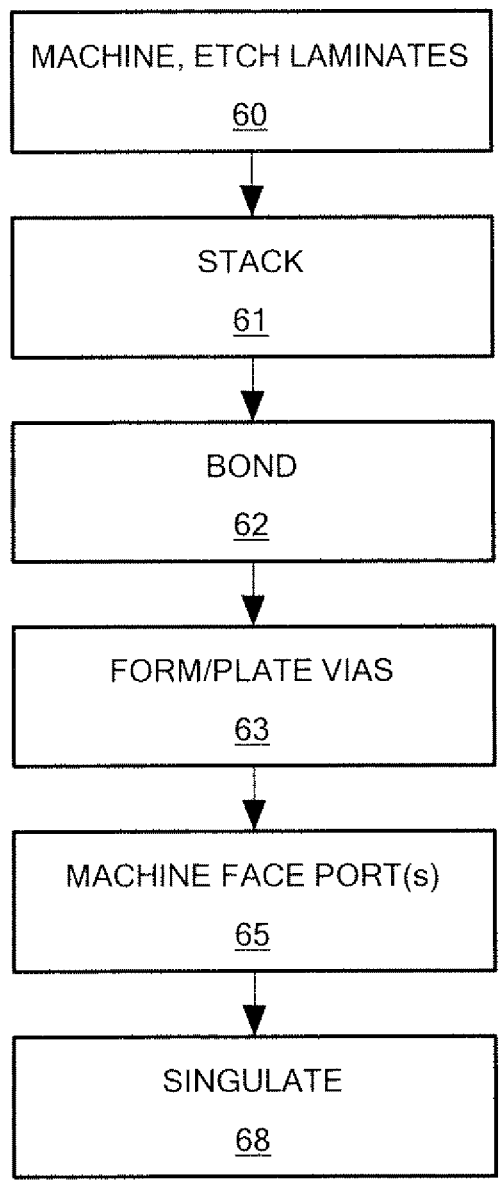
FIG. 8 is a flow chart depicting the primary steps associated with a fabrication process in accordance with the invention.

Thus, in accordance with one method associated with a preferred embodiment of the invention, the laminates discussed above with respect to FIG. 7 are machined, etched and the like (to form, for example, electrodes 16, FIG. 7A), step 61, FIG. 8, then stacked (see FIGS. 7A-7K), step 61, FIG. 8, and then bonded, step 62 using heat and pressure. The vias are formed and plated thereafter, step 63 and any surface ports are machined as needed, step 65. Then the individual valves are singulated, step 68. Any desired mechanical features can be added and/or formed at step 65.

Although specific features of the invention are shown in some drawings and not in others, however, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A printed circuit board electrorheological fluid valve comprising:
    a layup of vertically spaced, bonded, epoxy printed circuit board laminates defining a flow channels therebetween, wherein the flow channel extends from one edge of the printed circuit board laminates to another edge of the printed circuit board laminates and the flow channel changes direction vertically within the electrorheological fluid valve to cross at least one layer of printed circuit board laminates;
    a first electrode formed on the bottom side of the topmost printed circuit board laminate;
    a second electrode formed on the bottom side of the printed circuit board laminate that is located nearest above the flow channel in the region of the flow channel that is vertically lowest
    a third electrode formed on the top side of the bottommost printed circuit board laminate;
    a fourth electrode formed on the top side of the printed circuit board laminate that is located nearest below the flow channel in the region of the flow channel that is vertically highest,
    wherein the first electrode, the second electrode, the third electrode, and the fourth electrode are configured to control the flow of electrorheological fluid in the flow channel by applying voltages thereto; and
    a threaded port fluidly connected to the flow channel with a threaded nozzle fitted thereto, wherein the threaded port runs from the top side of the topmost printed circuit board laminate vertically downward through the second electrode.

2. The printed circuit board electrorheological fluid valve of claim 1, further comprising one or more surface pads on one or more of the printed circuit board laminates, each surface pad being selectively, electrically connected to at least one of the first electrode, second electrode, third electrode, or fourth electrode through vias.

3. The printed circuit board electrorheological fluid valve of claim 1 further comprising one or more printed circuit board laminates with one or more electronic components, wherein the one or more electronic components are electronic circuit control chips that are physically secured to the one or more printed circuit board laminates.

4. The printed circuit board electrorheological fluid valve of claim 1 in which multiple electrodes are formed on one or more individual printed circuit board laminates.

5. The printed circuit board electrorheological fluid valve of claim 1 in which multiple, individually addressable electrodes are formed on one or more individual printed circuit board laminates.

6. The printed circuit board electrorheological fluid valve of claim 1 further comprising one or more anchoring devices configured to snap the printed circuit board electrorheological fluid valve onto other components.

7. The printed circuit board electrorheological fluid valve of claim 1 further comprising a port in a face of the printed circuit board electrorheological fluid valve or one or more edge ports fluidly connected to the flow channel.

8. The printed circuit board electrorheological fluid valve of claim 1 in which the flow channel changes direction laterally within the printed circuit board electrorheological fluid valve.

9. The printed circuit board electrorheological fluid valve of claim 1 in which there is a plurality of internal printed circuit board laminates spaced between the topmost printed circuit board laminate and the bottommost printed circuit board laminate.

10. The printed circuit board electrorheological fluid valve of claim 1 in which there are spacer layer printed circuit board laminates between the topmost printed circuit board laminate and the bottommost printed circuit board laminate.

11. The printed circuit board electrorheological fluid valve of claim 1 further comprising heat fins configured to remove heat from the flow channel.

12. A method of manufacturing a printed circuit board electrorheological fluid valve comprising:
    assembling a layup including a plurality of vertically spaced, bonded, epoxy printed circuit board laminates defining a first electrode, a second electrode, a third electrode, and a fourth electrode and a flow channel, the flow channel extending from one edge of the printed circuit board laminates to another edge of the printed circuit board laminates, wherein the flow channel changes direction vertically within the electrorheological fluid valve to cross at least one layer of printed circuit board laminates, wherein the first electrode is formed on the bottom side of the topmost printed circuit board laminate, the second electrode is formed on the bottom side of the printed circuit board laminate that is located nearest above the flow channel in the region of the flow channel that is vertically lowest, the third electrode is formed on the top side of the bottommost printed circuit board laminate, and the fourth electrode is formed on the top side of the printed circuit board laminate that is located nearest below the flow channel in the region of the flow channel that is vertically highest, and wherein the first electrode, the second electrode, the third electrode, and the fourth electrode are configured to control flow of electrorheological fluid in the flow channel by applying voltages thereto;

consolidating the layup using heat and pressure to bond the printed circuit board laminates and the electrodes together;

drilling, for each individual printed circuit board electrorheological fluid valve, a threaded port that is fluidly connected to the flow channel and runs from the top side of the topmost printed circuit board laminate vertically downward through the second electrode;

fitting, for each individual printed circuit board electrorheological fluid valve, a threaded nozzle to the threaded port; and singulating individual printed circuit board electrorheological fluid valves from the consolidated layup.

13. The method of claim 12 further comprising:
forming vias connected to the electrodes.

14. The method of claim 12 further comprising:
machining the consolidated layup to form one or more edge ports fluidly connected to the flow channel.

15. The method of claim 12 in which singulating comprises exposing the flow channel.

16. The method of claim 12 wherein the flow channel changes direction laterally.

17. The method of claim 12 wherein one or more of the printed circuit board laminates comprise one or more electronic components, and wherein the one or more electronic components are electronic circuit control chips that are physically secured to the one or more printed circuit board laminates.

18. A method comprising:
bonding vertically a layup of printed circuit board laminates to form an electrorheological fluid valve with a flow channel therein that extends from one edge of the printed circuit board laminates to another edge of the printed circuit board laminates, wherein the flow channel changes direction vertically within the electrorheological fluid valve to cross at least one layer of printed circuit board laminates, wherein the electrorheological fluid valve comprises:

a first electrode formed on the bottom side of the topmost printed circuit board laminate;

a second electrode formed on the bottom side of the printed circuit board laminate that is located nearest above the flow channel in the region of the flow channel that is vertically lowest;

a third electrode formed on the top side of the bottommost printed circuit board laminate; and a fourth electrode formed on the top side of the printed circuit board laminate that is located nearest below the flow channel in the region of the flow channel that is vertically highest;

drilling a threaded port fluidly connected to the flow channel that runs from the top side of the topmost printed circuit board laminate vertically downward through the second electrode;

fitting a threaded nozzle to the threaded port;

forming surface pads;

electrically connecting the surface pads to select electrodes; and adding one or more mechanical features on the printed circuit board electrorheological fluid valve, wherein the one or more mechanical features comprise one or more anchoring devices configured to snap the printed circuit board electrorheological fluid valve onto other components, and wherein the mechanical features are configured to connect fluid ports for kinematically locating the printed circuit board electrorheological fluid valve.

19. The method of claim 18 in which bonding the printed circuit board laminates comprises:
assembling a layup including a plurality of spaced, bonded, epoxy printed circuit board laminates defining the first electrode, the second electrode, the third electrode, and the fourth electrode and the flow channel; and
consolidating the layup using heat and pressure to bond the printed circuit board laminates together.

20. The method of claim 19 wherein the layup defines the flow channel so the flow channel changes direction laterally.

21. The method of claim 18 in which electrically connecting the surface pads to select electrodes comprises forming vias interconnecting select surface pads and select electrodes.

22. The method of claim 18 further comprising:
adding one or more electronic components to one or more printed circuit board laminates, wherein the one or more electronic components are electronic circuit control chips that are physically secured to the one or more printed circuit board laminates.

23. The method of claim 18 in which bonding one or more printed circuit board laminates comprises bonding one or more individual printed circuit board laminates with multiple electrodes thereon.

24. The method of claim 18 further comprising:
forming an edge port in the printed circuit board electrorheological fluid valve, wherein the edge port is fluidly connected to the flow channel.

25. The method of claim 18 further comprising:
forming heat fins configured to remove heat from the flow channel.

* * * * *

UNITED STATES PATENT AND TRADEMARK OFFICE
CERTIFICATE OF CORRECTION

| | | |
|---|---|---|
| PATENT NO. | : 9,441,753 B2 | Page 1 of 1 |
| APPLICATION NO. | : 13/873294 | |
| DATED | : September 13, 2016 | |
| INVENTOR(S) | : Marc Strauss et al. | |

It is certified that error appears in the above-identified patent and that said Letters Patent is hereby corrected as shown below:

Title page, Assignee Name: Replace "Boston Dynamics, Waltham, MA (US)" with "Boston Dynamics, Inc., Waltham, MA (US)".

In the Claims

Claim 1, column 5, line 59: Replace "channels" with "channel".

Claim 1, column 6, line 4: Add a ";" after "lowest".

Signed and Sealed this
Eighth Day of November, 2016

Michelle K. Lee
*Director of the United States Patent and Trademark Office*